United States Patent
Chakraborty et al.

(10) Patent No.: US 11,683,026 B1
(45) Date of Patent: Jun. 20, 2023

(54) CALIBRATING SIGNAL CURRENTS IN A RADIO FREQUENCY SIGNAL GENERATOR

(71) Applicant: International Business Machines Corporation, Armonk, NY (US)

(72) Inventors: Sudipto Chakraborty, Plano, TX (US); John Francis Bulzacchelli, Somers, NY (US); Andrew D. Davies, Rochester, MN (US); Daniel Joseph Friedman, Sleepy Hollow, NY (US); David James Frank, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/898,695

(22) Filed: Aug. 30, 2022

(51) Int. Cl.
*H03K 5/01* (2006.01)
*H03K 17/92* (2006.01)

(52) U.S. Cl.
CPC .............. *H03K 5/01* (2013.01); *H03K 17/92* (2013.01)

(58) Field of Classification Search
CPC ................................. H03K 5/01; H03K 17/92
USPC ......................................................... 327/103
See application file for complete search history.

(56) References Cited

U.S. PATENT DOCUMENTS

| 7,280,805 | B2 | 10/2007 | Xu et al. |
| 7,346,313 | B2 | 3/2008 | Cafarella |
| 9,025,648 | B2 | 5/2015 | Azary |
| 9,859,997 | B1 | 1/2018 | Lin et al. |
| 10,879,923 | B1 | 12/2020 | Chakraborty et al. |
| 10,958,217 | B2 | 3/2021 | D'Alessandro |
| 10,985,769 | B2 | 4/2021 | Patukuri et al. |
| 11,012,104 | B2 | 5/2021 | McLaurin et al. |
| 11,057,069 | B2 | 7/2021 | Meng |
| 11,228,478 | B1* | 1/2022 | Neofytou .............. H04L 27/366 |
| 11,277,118 | B2 | 3/2022 | Hong et al. |

(Continued)

FOREIGN PATENT DOCUMENTS

| EP | 1703633 A2 | 9/2006 |
| EP | 2779472 A2 | 4/2016 |

OTHER PUBLICATIONS

H. Minn et al., "In-phase and Quadrature Timing Mismatch Estimation and Compensation in Millimeter-wave Communication Systems," IEEE Transactions on Wireless Communications, Jul. 2017, 15 pages, vol. 16, No. 7.

(Continued)

*Primary Examiner* — Tomi Skibinski
(74) *Attorney, Agent, or Firm* — Erik Johnson; Ryan, Mason & Lewis, LLP

(57) ABSTRACT

Techniques are provided for calibrating signal currents in a radio frequency signal generator system, such as an arbitrary waveform generator system. A device comprises a current measurement circuit and a current imbalance correction circuit. The current measurement circuit is configured, during a calibration process, to measure a first current in a first signal path of a radio frequency signal generator, and to measure a second current in a second signal path of the radio frequency signal generator. The current imbalance correction circuit is configured to adjust a current level in at least one of the first signal path and the second signal path of the radio frequency signal generator to correct for an imbalance between the measured first current and the measured second current.

25 Claims, 12 Drawing Sheets

(56) References Cited

U.S. PATENT DOCUMENTS

2020/0382088 A1  12/2020  Saha
2021/0367687 A1  11/2021  Nayebi et al.

OTHER PUBLICATIONS

Y. Shen et al., "A Wideband IQ-Mapping Direct-Digital RF Modulator for 5G Transmitters," IEEE Journal of Solid-State Circuits, Feb. 4, 2022, 11 pages.

J. Meng et al., "I/Q Linear Phase Imbalance Estimation Technique of the Wideband Zero-IF Receiver," Electronics, Oct. 28, 2020, 14 pages, vol. 9, No. 11.

X. Peng et al., "A Blind Calibration Model for I/Q Imbalances of Wideband Zero-IF Receivers," Electronics, Nov. 6, 2020, 16 pages, vol. 9, No. 11.

S. Jayasuriya et al., "A Baseband Technique for Automated LO Leakage Suppression Achieving <-80dBm in Wideband Passive Mixer-First Receivers," Proceedings of the IEEE 2014 Custom Integrated Circuits Conference, Sep. 15-17, 2014, 4 pages.

\* cited by examiner

| LO_I | $\overline{LO\_I}$ | LO_Q | $\overline{LO\_Q}$ | SW0 | SW1 | MEASURE | NODE |
|---|---|---|---|---|---|---|---|
| LOW | HIGH | HIGH | HIGH | ON | OFF | $I^-$ | INT_0 |
| LOW | HIGH | HIGH | HIGH | OFF | ON | $I^+$ | INT_1 |
| HIGH | LOW | HIGH | HIGH | ON | OFF | $I^+$ | INT_0 |
| HIGH | LOW | HIGH | HIGH | OFF | ON | $I^-$ | INT_1 |
| HIGH | HIGH | LOW | HIGH | ON | OFF | $Q^-$ | INT_0 |
| HIGH | HIGH | LOW | HIGH | OFF | ON | $Q^+$ | INT_1 |
| HIGH | HIGH | HIGH | LOW | ON | OFF | $Q^+$ | INT_0 |
| HIGH | HIGH | HIGH | LOW | OFF | ON | $Q^-$ | INT_1 |

800

900

1000

US 11,683,026 B1

CALIBRATING SIGNAL CURRENTS IN A RADIO FREQUENCY SIGNAL GENERATOR

BACKGROUND

This disclosure relates generally to radio frequency (RF) signal generators, and techniques for calibrating RF signal generators such as arbitrary waveform generator (AWG) systems. For various applications, an RF signal generator comprises a quadrature architecture in which a baseband signal is upconverted to an RF signal using a single-sideband (SSB) modulation system which modulates quadrature local oscillator (LO) signals using quadrature baseband signals. For SSB modulation, generating high-fidelity RF signals without LO leakage or sideband image spurs (or significantly suppressed spurs), requires a precise amplitude balance and phase balance between in-phase (I) and quadrature-phase (Q) signal components. More specifically, an amplitude and phase imbalance between the quadrature I/Q signal components can lead to degraded image rejection performance, which results in the presence of unwanted sideband spurs. Moreover, a DC offset between positive and negative components in the same phase (e.g., $I^+$ and $I^-$) can result in an LO leakage spur. Measuring and calibrating I/Q imbalances is particularly important when the signal paths for I and Q channels are realized using single-ended baseband filter structures. Due to device mismatches, the single-ended filter elements may present inherent amplitude imbalances that compromise RF performance.

Conventional techniques for detecting and calibrating amplitude and phase imbalances of I/Q signals in an RF signal generator typically utilize on-chip or off-chip calibration instrumentation which is configured to perform RF measurements to analyze RF output signals that are generated by the RF signal generator. For example, a conventional on-chip calibration instrumentation implements an RF down-conversion receiver, which is disposed in a feedback path of a transmitter and configured to extract baseband signal components from the RF output signal. The on-chip calibration instrumentation compensates for imbalances that are detected in the extracted baseband signal components. In addition, conventional on-chip and off-chip calibration instrumentation can be implemented using complex spectrum analyzer systems and circuitry. The conventional calibration systems which perform RF measurements are significantly costly in terms of hardware complexity, resource usage, and area overhead needed for on-chip implementation. In addition, conventional calibration systems which perform RF measurements consume a significant amount of power, which is prohibitive at cryogenic temperatures.

SUMMARY

Exemplary embodiments of the disclosure include techniques for calibrating signal currents in an RF signal generator system, such as an AWG system.

In an exemplary embodiment, a device comprises a current measurement circuit and a current imbalance correction circuit. The current measurement circuit is configured, during a calibration process, to measure a first current in a first signal path of a radio frequency signal generator, and to measure a second current in a second signal path of the radio frequency signal generator. The current imbalance correction circuit is configured to adjust a current level in at least one of the first signal path and the second signal path of the radio frequency signal generator to correct for an imbalance between the measured first current and the measured second current.

Advantageously, in contrast to conventional calibration techniques which perform RF measurements to analyze RF output signals that are generated by an RF signal generator, calibration techniques according to exemplary embodiments of the disclosure implement current measurement circuitry to measure signal currents (e.g., DC baseband currents) generated in the signal paths of an RF signal generator during a calibration process, wherein such baseband signal current measurements are significantly less costly in terms of hardware complexity and computing resources needed for calibration, as compared to calibration systems which analyze the RF output signals generated by the RF signal generator. In addition, the current measurement circuitry can operate at very low power (e.g., order of milliwatts or less) and has a relatively low footprint (occupies small chip area), which is advantageous for on-chip implementation and cryogenic control electronics for quantum computing applications.

Another advantage is that for a quadrature RF signal generator architecture which utilizes I/Q signals, the same current measurement circuitry is utilized to measure all components (e.g., $I^+$, $I^-$, $Q^+$, $Q^-$) of the I/Q baseband signals. In this regard, the current measurements are not sensitive to the intrinsic offsets of the current measurement circuitry, whereby inaccuracies of the current measurement circuitry will not adversely impact the accuracy of the measurements since any intrinsic offset in the current measurement circuitry will be applied to all the signal current measurements, which effectively cancels out such intrinsic errors when a difference between the measured currents is determined.

Another exemplary embodiment includes a system which comprises a radio frequency signal generator and a calibration system. The radio frequency signal generator is configured to convert a baseband signal to a radio frequency signal. The radio frequency signal generator comprises a first signal path to process a first signal component of the baseband signal, and a second signal path to process a second signal component of the baseband signal. The calibration system is configured to perform a calibration process to calibrate the radio frequency signal generator. The calibration system comprises a current measurement circuit, and a current imbalance correction circuit. The current measurement circuit is configured, during the calibration process, to measure a first current in the first signal path of the radio frequency signal generator, and to measure a second current in the second signal path of the radio frequency signal generator. The current imbalance correction circuit is configured to adjust a current level in at least one of the first signal path and the second signal path of the radio frequency signal generator to correct for an imbalance between the measured first current and the measured second current.

Another exemplary embodiment includes a system which comprises a quantum processor, an arbitrary waveform generator system, and a calibration system. The quantum processor comprises at least one superconducting quantum bit. The arbitrary waveform generator system comprises at least one arbitrary waveform generator channel configured to convert a baseband signal to a radio frequency control pulse which controls the at least one superconducting quantum bit. The at least one arbitrary waveform generator channel comprises a first signal path to process a first signal component of the baseband signal, and a second signal path to process a second signal component of the baseband signal. The calibration system is configured to perform a calibration process to calibrate the at least one arbitrary waveform generator channel. The calibration system comprises a current measurement circuit, and a current imbalance correction circuit. The current measurement circuit is configured, during the calibration process, to measure a first current in the first signal path of the at least one arbitrary waveform generator channel, and to measure a second current in the second signal path of the at least one arbitrary waveform generator channel. The current imbalance correction circuit is configured to adjust a current level in at least one of the first signal path and the second signal path of the at least one arbitrary waveform generator channel to correct for an imbalance between the measured first current and the measured second current.

Another exemplary embodiment, as may be combined with the preceding paragraphs, comprises control circuitry which is configured to determine a difference between the measured first current and the measured second current, generate a control signal based on the determined difference between the measured first current and the measured second current, and output the control signal to the current imbalance correction circuit. In response to the control signal, the current imbalance correction circuit is configured to inject a current into at least one of the first signal path and the second signal path of the radio frequency signal generator to compensate for the determined difference between the measured first current and the measured second current.

In another exemplary embodiment, as may be combined with the preceding paragraphs, the current measurement circuit comprises a current mode digital-to-analog converter circuit and a current comparator circuit. The current mode digital-to-analog converter circuit is configured to generate a reference current. The current comparator circuit is configured to receive one of the first current and the second current as an input current to be measured, compare the reference current with the input current, and generate a compare output signal. The current mode digital-to-analog converter circuit is configured to one of increase and decrease the reference current until the current comparator circuit generates a compare output signal which indicates that a magnitude of the reference current is substantially equal to a magnitude of the input current.

In another exemplary embodiment, as may be combined with the preceding paragraphs, the current comparator circuit comprises a first transistor, a second transistor, a first switch, a second switch, and a voltage comparator. The first transistor comprises a drain terminal coupled to an input node of the comparator circuit, a source terminal coupled to a power supply node, and a gate terminal coupled to a first node. The first switch is coupled between the input node and the first node. The second switch is coupled between the first node and the power supply node. The second transistor comprises a gate terminal coupled to the first node, a source terminal coupled to the power supply node, and a drain terminal coupled to a second node. The voltage comparator comprises a first input terminal coupled to a threshold voltage node, and a second input terminal coupled to the second node. An output of the current mode digital-to-analog converter circuit is coupled to the second node. During the calibration process, the first switch is activated to configure the first transistor as a diode-connected transistor by coupling the gate terminal and the drain terminal of the first transistor, and the second switch is deactivated, to enable the input current to flow into the current measurement circuit.

In another exemplary embodiment, as may be combined with the preceding paragraphs, the current comparator circuit further comprises a low-pass filter circuit which is configured to enable the current comparator circuit to measure a direct current (DC) offset component of an alternating current (AC) input current. The low-pass filter circuit is one of (i) coupled between the first node and the gate terminal of the second transistor, and (ii) coupled to the second input terminal of the voltage comparator.

Another exemplary embodiment includes a computer program product for performing a calibration process to calibrate a radio frequency signal generator. The computer program product comprises one or more computer readable storage media, and program instructions collectively stored on the one or more computer readable storage media. The program instructions comprise program instructions to configure a current measurement circuit, during the calibration process, to measure a first current in a first signal path of the radio frequency signal generator, and to measure a second current in a second signal path of the radio frequency signal generator; and program instructions to configure a current imbalance correction circuit to adjust a current level in at least one of the first signal path and the second signal path of the radio frequency signal generator to correct for an imbalance between the measured first current and the measured second current.

Another exemplary embodiment includes a method which comprises measuring a first current in a first signal path of a radio frequency signal generator; measuring a second current in a second signal path of the radio frequency signal generator; and adjusting a current level in at least one of the first signal path and the second signal path of the radio frequency signal generator to correct for an imbalance between the measured first current and the measured second current.

Other embodiments will be described in the following detailed description of exemplary embodiments, which is to be read in conjunction with the accompanying figures.

DETAILED DESCRIPTION

Exemplary embodiments of the disclosure will now be described in further detail with regard to systems and methods for calibrating signal currents in an RF signal generator system, such as an AWG system. It is to be understood that the various features shown in the accompanying drawings are schematic illustrations that are not drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the term "exemplary" as used herein means "serving as an example, instance, or illustration." Any embodiment or design described herein as "exemplary" is not to be construed as preferred or advantageous over other embodiments or designs.

Further, it is to be understood that the phrase "configured to" as used in conjunction with a circuit, structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, wherein the hardware may comprise discrete circuit elements (e.g., transistors, inverters, etc.), programmable elements (e.g., application specific integrated circuit (ASIC) chips, field-programmable gate array (FPGA) chips, etc.), processing devices (e.g., central processing units (CPUs), graphics processing units (GPUs), etc.), one or more integrated circuits, and/or combinations thereof. Thus, by way of example only, when a circuit, structure, element, component, etc., is defined to be configured to provide a specific functionality, it is intended to cover, but not be limited to, embodiments where the circuit, structure, element, component, etc., is comprised of elements, processing devices, and/or integrated circuits that enable it to perform the specific functionality when in an operational state (e.g., connected or otherwise deployed in a system, powered on, receiving an input, and/or producing an output), as well as cover embodiments when the circuit, structure, element, component, etc., is in a non-operational state (e.g., not connected nor otherwise deployed in a system, not powered on, not receiving an input, and/or not producing an output) or in a partial operational state.

Figure 1:
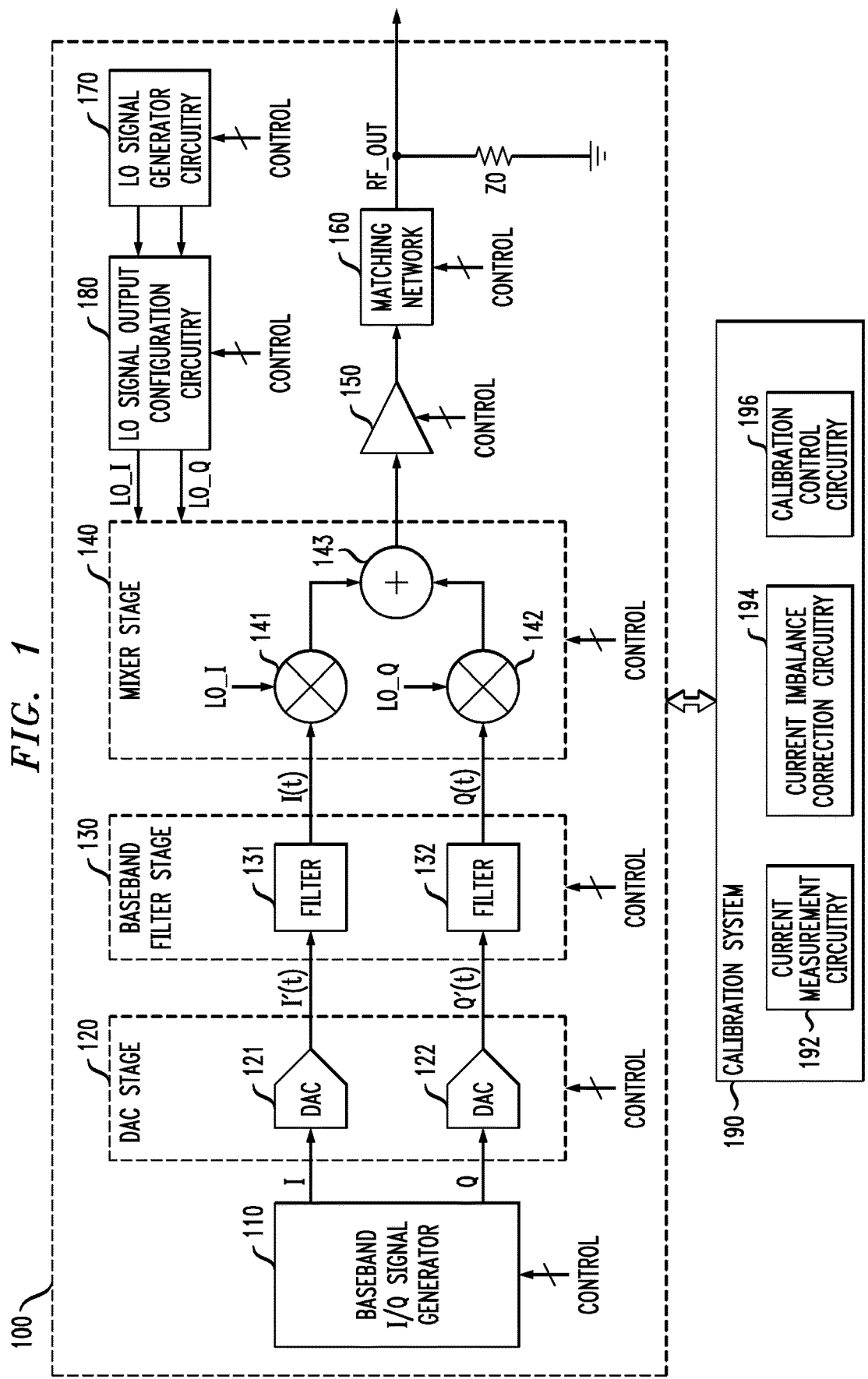
FIG. 1 schematically illustrates a radio frequency signal generator system and calibration system which is configured to calibrate baseband signals in the radio frequency signal generator system, according to an exemplary embodiment of the disclosure.

FIG. 1 schematically illustrates a radio frequency signal generator system and a calibration system which is configured to calibrate baseband currents in signal paths of the radio frequency signal generator system, according to an exemplary embodiment of the disclosure. In particular, FIG. 1 schematically illustrates an RF signal generator system 100 which comprises a baseband I/Q signal generator 110, a digital-to-analog converter stage 120 (or DAC stage 120), a baseband filter stage 130, a mixer stage 140, an amplifier stage 150, an impedance matching network 160, local oscillator (LO) signal generator circuitry 170, and LO signal output configuration circuitry 180, the functions of which will be explained in further detail below. A calibration system 190 comprises current measurement circuitry 192, current imbalance correction circuitry 194, and calibration control circuitry 196, the functions of which will be explained in further detail below.

As schematically illustrated in FIG. 1, the DAC stage 120 comprises inputs that are coupled to outputs of the baseband I/Q signal generator 110. The baseband filter stage 130 comprises inputs that are coupled to outputs of the DAC stage 120. The mixer stage 140 comprises inputs that are coupled to outputs of the baseband filter stage 130. The amplifier stage 150 comprises inputs that are coupled to outputs of the mixer stage 140, and an output that is coupled to an input of the impedance matching network 160, and an output of the impedance matching network 160 is coupled to an output node (RF_OUT) of the RF signal generator system 100. The LO signal generator circuitry 170 is configured to generate LO signals (e.g., quadrature LO signals) that are utilized by the mixer stage 140 to perform amplitude modulation of an in-phase LO signal (LO_I) and a quadrature-phase LO signal (LO_Q). The LO signal output configuration circuitry 180 is configured to control the input of the LO signals to the mixer stage 140 for different modes of operation of the RF signal generator system 100 (e.g., real-time operating mode, and calibration mode), as will be discussed in further detail below.

It is to be understood that the RF signal generator system 100 can be implemented for various applications. For example, in some embodiments, the RF signal generator system 100 comprises an RF transmitter for a wireless application, wherein an output of the RF signal generator system 100 is coupled to an antenna system which is configured to transmit an RF output signal that is generated by the RF signal generator system 100. In other embodiments, the RF signal generator system 100 comprises a waveform generator (e.g., an arbitrary waveform generator (AWG), or a function generator) in which the output of the RF signal generator system 100 is coupled to an input of a sensor device, wherein the RF output signal that is generated by the RF signal generator system 100 is configured to excite the sensor device. In other embodiments, the RF signal generator system 100 comprises an AWG system which is implemented for a quantum computing application, wherein the RF signal generator system 100 is configured to generate an RF control pulse for controlling the operation of, e.g., a superconducting quantum bit (qubit), an active superconducting coupler circuit which couples two superconducting qubits, or other superconducting quantum devices, etc.

In the context of the exemplary embodiments discussed herein, an RF signal comprises a signal which has a frequency ranging from, e.g., about 20 kHz to about 300 GHz. In some embodiments, the RF signal generator system 100 comprises an analog quadrature system that is configured to generate quadrature (I/Q) signals (e.g., baseband I/Q signals and LO I/Q signals) and perform quadrature modulation (or I/Q signal modulation) to generate RF signals for a given application. As is known in the art, a quadrature signal comprises an in-phase (I) signal component, and a quadrature-phase (Q) signal component. A pair of signals that are in quadrature have the same frequency, but differ in phase by 90 degrees. For example, by convention, the I signal is cosine waveform, and the Q signal is a sine waveform. For illustrative purposes, exemplary embodiments of the disclosure will be described in the context of quadrature RF signal generator systems, although the exemplary signal processing circuitry and methods as discussed herein can be implemented with other types of RF signal generator systems and modulation techniques.

In the exemplary embodiment of FIG. 1, the baseband I/Q signal generator 110 is configured to generate digital quadrature signals I and Q which represent input baseband data for a given application. For example, for quantum computing applications, the baseband I/Q signal generator 110 is configured to implement pulse-shaping techniques to generate RF control pulses with desired envelope shapes (e.g., Gaussian pulses, cosine pulses (e.g., sum of half cosines), hyperbolic secant pulses, etc.), which are applied to superconducting qubits or active qubit coupler circuits to perform single qubit gate operations, entanglement gate operations, etc. In some embodiments, the baseband I/Q signal generator 110 implements digital signal processing techniques based on a combination of hardware and software to generate the digital quadrature baseband signals I and Q.

The DAC stage 120 is configured to convert the digital quadrature signals I and Q to analog baseband signals I'(t) and Q'(t) having a target baseband frequency. In particular, the DAC stage 120 comprises multi-bit DAC circuits including a first DAC circuit 121 and a second DAC circuit 122. The first DAC circuit 121 is configured to convert the digital baseband component I to an analog baseband component I'(t) having a baseband frequency, and the second DAC circuit 122 is configured to convert the digital baseband component Q to an analog baseband component Q'(t) having the same baseband frequency, but phase-shifted by 90 degrees relative to I'(t). The DAC stage 120 generates and outputs the analog baseband signals I'(t) and Q'(t) at a given sampling rate ($f_S$) or sampling frequency, e.g., baseband frequencies in a range of about 100 kHz to about 1 GHz depending on the given application. In some embodiments, the first and second DAC circuits 121 and 122 implement a configurable hardware framework in which various operating parameters of the DAC stage 120 can be adjusted by digital control signals that are input to the DAC stage 120. For example, in some embodiments, the digital control can be utilized to adjust DAC operating parameters including, but not limited to, the sampling rate, analog output gain, etc.

Based on the Nyquist Sampling Theorem, the highest fundamental output frequency $f_O$ signal a DAC with sampling frequency $f_S$ can generate is equal to half the sampling rate or $f_S/2$ (referred to as the first Nyquist zone). In the frequency domain, when generating a sinusoidal waveform of frequency $f_O$, the fundamental baseband frequency $f_O$ will appear as a spectral component at $f_O$, and there will be additional higher frequency components that are generated at the output of the DAC stage 120, which are referred to as "images" and which are a function of $f_S$ and $f_O$. For example, the higher frequency components are determined as $|(n \times f_S) \pm f_O|$, where n=1, 2, 3, . . . . The images have the same information content as the fundamental spectral components, but at higher frequencies and at smaller amplitudes. The unwanted images are suppressed/rejected using, e.g., the baseband filter stage 130.

The baseband filter stage 130 is configured to filter the analog baseband signals I'(t) and Q'(t) output from the DAC stage 120 and thereby generate filtered analog baseband signals I(t) and Q(t). The baseband filter stage 130 comprises a first filter circuit 131 and a second filter circuit 132. The first filter circuit 131 is configured to filter the in-phase analog signal I'(t) output from the first DAC circuit 121, and the second filter circuit 132 is configured to filter the quadrature-phase analog signal Q'(t) output from the second DAC circuit 122. In some embodiments, the first and second filter circuits 131 and 132 comprise low-pass filters that are configured to pass the fundamental spectral components of the respective analog signals I'(t) and Q'(t), while suppressing the image components of the respective analog signals I'(t) and Q'(t). In other embodiments, the first and second filter circuits 131 and 132 can be configured as bandpass filters to pass a desired band of higher frequency image components of the respective analog signals I'(t) and Q'(t), while suppressing the fundamental spectral components and other image components of the respective analog signals I'(t) and Q'(t). In other embodiments, the first and second filter circuits 131 and 132 can be configured as high-pass filters, as may be desired for a given application.

In some embodiments, the baseband filter stage 130 comprises configurable filter circuits in which, e.g., the cutoff frequencies of the first and second filter circuits 131 and 132 can be adjusted, or where the first and second filter circuits 131 and 132 can be configured to have different filter types (e.g., low-pass, band-pass, etc.) as desired for a given application. For example, in some embodiments, a bandpass filter can be configured using two low pass filters using known signal filtering techniques and architectures. In some embodiments, the filter configurations are digitally controlled by the digital control signals that are input to the baseband filter stage 130.

For example, a higher DAC sampling frequency can be utilized as needed to transmit baseband data and/or relax the filter response of the downstream filters of the baseband filter stage 130. Indeed, an increase in the DAC sampling frequency results in the possibility of accommodating higher baseband transmission frequency (i.e., the analog signals I'(t) and Q'(t) have a higher baseband frequency). In addition, an increase in the DAC sampling frequency results in an increase in the separation between the center frequency $f_O$ of the baseband component and the center frequencies $n \times f_S \pm f_O$ of the higher frequency images, which relaxes the required sharpness of the filter cutoffs at corner frequencies of the filters. However, the higher DAC sampling rate results in increased power consumption. So, a tradeoff in power consumption with DAC sampling frequency, and the sharpness of the filter cutoffs at the corner frequencies of the filters are factors that should be considered.

In some embodiments, the mixer stage 140 is configured to perform analog I/Q signal modulation, e.g., single-sideband (SSB) modulation, by mixing the filtered analog signals I(t) and Q(t), which are output from the baseband filter stage 130, with quadrature LO signals (e.g., an in-phase LO signal (LO_I) and a quadrature-phase LO signal (LO_Q)) to generate and output an analog RF signal (e.g., a single-sideband modulated RF output signal). The local oscillator signals LO_I and LO_Q each have the same LO frequency, but the LO_Q signal is phase-shifted by 90 degrees relative to the LO_I signal. For amplitude modulation, the filtered analog signals I(t) and Q(t) amplitude modulate the LO_I and LO_Q signals. It is desirable to ensure that the amplitude modulation level applied to the LO_I signal is well matched to the amplitude modulation level applied to the LO_Q signal. Otherwise, the in-phase (I) and quadrature-phase (Q) signal components of the RF output generated by the RF signal generator system 100 will be imbalanced, leading to degraded image rejection performance and the presence of unwanted sideband spurs.

More specifically, the mixer stage 140 comprises a first mixer circuit 141 (e.g., I mixer circuit), a second mixer circuit 142 (e.g., Q mixer circuit), and a signal combiner circuit 143. The first mixer circuit 141 is configured to mix the filtered analog signal I(t) with the LO_I signal and generate a first RF signal output. The second mixer circuit 142 is configured to mix the filtered analog signal Q(t) with the LO_Q signal and generate a second RF signal output. The first and second RF signals output from the first and second mixer circuits 141 and 142 are input to the signal combiner circuit 143 and combined (e.g., added) to generate a single-sideband RF signal output.

In some embodiments, a quadrature phase-shifter circuit is implemented to generate the quadrature LO signals LO_I and LO_Q signals. For example, a quadrature phase-shifter circuit is configured to receive an LO signal as input, and output the quadrature LO signals LO_I and LO_Q based on the LO input signal. In this configuration, the LO_I signal comprises the same frequency and phase as the input LO signal, and the LO_Q signal comprises the same frequency as the input LO signal, but with a phase shift of 90 degrees. The quadrature phase-shifter circuit can be implemented using one of various quadrature phase shifting techniques known to those of ordinary skill in the art.

The mixer stage 140 performs an up-conversion mixing process which is configured to generate an RF analog signal which has a center frequency that is greater than the baseband frequency of the baseband signals output from the DAC stage 120. In some embodiments, the LO frequency of the mixer stage 140 is in a range of 100 MHz to about 10 GHz, depending on the application. More specifically, as is understood by those of ordinary skill in the art, as a result of the mixing operations of the first and second mixer circuits 141 and 142, the first and second RF signals that are output from the respective first and second mixer circuits 141 and 142 each comprise a double-sideband RF signal. A double-sideband signal comprises an upper sideband (USB) and a lower sideband (LSB) which are disposed at equal distances above and below the LO frequency. The upper sideband comprises a spectral band of frequencies that is higher than the LO frequency, and the lower sideband comprises a spectral band of frequencies that is lower than the LO frequency. The upper and lower sidebands each carry the same information content of the IQ signals. For example, assume that the filtered analog signals I(t) and Q(t) (i.e., the modulating signals) have a center frequency $f_M$ (intermediate frequency) and that the LO signal has a frequency $f_{LO}$. The first and second RF signals that are output from the first and second mixer circuits 141 and 142 will each have (i) an upper sideband of spectral components, which is frequency-band centered at a frequency of $(f_{LO}+f_M)$ and (ii) a lower sideband of spectral components, which is frequency-band centered at a frequency of $(f_{LO}-f_M)$.

In some embodiments, the signal combiner circuit 143 is configured to add the first and second RF signals which are output from the first and second mixer circuits 141 and 142, in which case the signal combiner circuit 143 will output the "real" lower sideband signal as a single-sideband modulated RF signal (with a suppressed carrier frequency) having a center frequency which is upconverted from the frequency $f_M$ of the modulating signals I(t) and Q(t) to a center frequency $(f_{LO}-f_M)$ of the lower sideband. In other embodiments, the signal combiner circuit 143 is configured to subtract the first and second RF signals which are output from the first and second mixer circuits 141 and 142, in which case the signal combiner circuit 143 will output the "real" upper sideband signal as a single-sideband modulated RF signal (with a suppressed carrier) having a center frequency which is upconverted from the frequency $f_M$ of the modulating signals I(t) and Q(t) to a center frequency $(f_{LO}+f_M)$ of the upper sideband. In other embodiments, the mixer stage 140 is configured as a double-sideband modulator (with a suppressed carrier frequency). More specifically, the mixer stage 140 can be configured to provide double-sideband modulation by maintaining the LO_Q input to the second mixer 142 at a constant zero voltage level (i.e., LO_Q=0). In this instance, the second mixer circuit 142 will have a zero output (i.e., no RF signal is output from the second mixer circuit 142), and the output of the signal combiner circuit 143 will be the double-sideband RF signal output from the first mixer circuit 141.

The amplifier stage 150 is configured to receive the modulated RF signal, which is output from the mixer stage 140, and amplify or attenuate the modulated RF signal to a desired power level, and drive the output of the RF signal generator system 100 (e.g., drive an antenna, sensor device, qubit, etc., which is coupled to the output of the RF signal generator system 100). In some embodiments, the amplifier stage 150 comprises a programmable gain, wherein gain can be expressed as a difference between the input power level (at the input to the amplifier stage 150) and the output power level (at the output of the amplifier stage 150) or, more specifically, as a ratio of output to input power. In some embodiments, the amplifier stage 150 is utilized to increase the power level of the RF output signal to a level which is sufficient to transmit (wirelessly, or wired) the modulated RF signal at given power level and over a required transmission distance. In other embodiments, the amplifier stage 150 comprises a programmable gain attenuation stage. The programmable gain attenuation stage comprises a programmable amplifier which is configured to amplify a modulated RF signal with a gain factor of 1, or less than 1. In this manner, the programmable gain attenuation stage can attenuate the power level of modulated RF signals that are output from the mixer stage 140, as desired, for a given application.

The impedance matching network 160 is configured to match a source impedance or load impedance of the output of the amplifier stage 150 to a characteristic impedance of an output load (e.g., antenna input, diplexer, etc.) of the RF signal generator system 100. In some embodiments, the impedance matching network 160 comprises a balun to convert a differential/balanced output of the amplifier stage 150 to a single-ended/unbalanced output. In some embodiments, the resonance parameters (e.g., impedance and bandwidth) of the impedance matching network 160 remain substantially invariant, wherein the impedance matching network 160 is designed with a center frequency which corresponds to a desired operating frequency of the load. In other embodiments, the impedance matching network 160 is configured with a plurality of injection points to provide different impedance matching and filtering characteristics.

The different injection points can be selected by digital control signals applied to the impedance matching network 160. The impedance matching network 160 can have high pass and low pass characteristics, wherein the different injection points can be selected to provide different impedance matching and response characteristics. In some embodiments, the impedance matching network 160 is designed with a high-Q factor, wherein the center frequency of the impedance matching network 160 can be adjusted to provide sufficient impedance matching for different transmission frequencies which are generated by, e.g., changing the sampling frequency of the DAC stage 120 and/or changing the LO frequency of the mixer stage 140, depending on the given application.

In some embodiments, the LO signal generator circuitry 170 is configured to generate quadrature LO signals LO_I and LO_Q with a target center frequency, which are utilized by the mixer stage 140 to perform I/Q modulation and up-conversion. In some embodiments, for a differential signal framework, the LO signal generator circuitry 170 is configured to generate complementary quadrature LO signals, which include complementary in-phase LO signals LO_I and $\overline{LO\_I}$, and complementary quadrature-phase LO signals LO_Q and $\overline{LO\_Q}$. Ideally, the complementary quadrature LO signals LO_I, LO_Q, $\overline{LO\_I}$, and $\overline{LO\_Q}$ have the same amplitude and center frequency, but different phases of 0°, 90°, 180°, and 270°, respectively.

The LO signal generator circuitry 170 is implemented using known circuit architectures and LO signal generation techniques. For example, in some embodiments, the LO signal generator circuitry 170 comprises a phase-locked loop (PLL) system which is configured to generate an LO signal with a target center frequency, and phase-shifter circuitry which converts the LO signal generated by the PLL system, into quadrature LO signals LO_I and LO_Q. For differential quadrature LO signals, in some embodiments, the LO signal generator circuitry 170 can implement a quadrature phase-shifter circuit which is configured to receive as input a complementary pair of LO signals, LO and $\overline{LO}$, and generate the complementary quadrature LO signals LO_I, LO_Q, $\overline{LO\_I}$, and $\overline{LO\_Q}$. In some embodiments, the quadrature phase-shifter circuit can be implemented using a quadrature polyphase phase-shifter circuit having a single polyphase filter stage, or multiple polyphase filter stages, as is known to those of ordinary skill in the art.

The LO signal output configuration circuitry 180 comprises LO signal driver stages which are configured to drive the LO inputs of the first and second mixer circuits 141 and 142 in the mixer stage 140 with the quadrature LO signals that are generated and output from the LO signal generator circuitry 170. As explained in further detail below, in a normal operating mode of the RF signal generator system 100, the LO signal output configuration circuitry 180 is configured to drive the LO inputs of the first and second mixer circuits 141 and 142 with the quadrature LO signals LO_I and LO_Q (or complementary quadrature LO signals) to perform normal I/Q modulation. In a calibration mode of the RF signal generator system 100, the LO signal output configuration circuitry 180 is configured to selectively drive the LO inputs of the first and second mixer circuits 141 and 142 with DC voltages that are configured to selectively activate and deactivate switching transistors of the first and second mixer circuits 141 and 142 to perform DC measurements of baseband currents, the details of which will be explained in further detail below. An exemplary embodiment of the LO signal output configuration circuitry 180 will be discussed in further detail below in conjunction with FIG. 5.

As shown in FIG. 1, the various signal processing stages 110, 120, 130, 140, 150, 160, 170, and 180 of the RF signal generator system 100 comprise control signal input ports that receive digital control signals from either the calibration system 190 or some processor or microcontroller which is configured to control operation of the RF signal generator system 100. The calibration system 190 can generate digital control signals to configure the RF signal generator system 100 to operate in calibration mode, and control the execution of a calibration process that is performed in calibration mode to calibrate I/Q signals of the RF signal generator system 100. Further, in some embodiments, some or all of the stages 110, 120, 130, 140, 150, 160, 170, and 180 have a configurable hardware framework in which various operating parameters of the stages can be adjusted by the digital control signals to adjust normal mode operations of the RF signal generator system 100.

In the exemplary I/Q modulation architecture of the RF signal generator system 100 shown in FIG. 1, it is desired to eliminate or otherwise substantially minimize imbalance between the baseband I and Q signals for purposes of image rejection. Indeed, an I/Q imbalance can result in an unwanted spectral component at the image frequency. As noted above, the SSB mixer is configured to upconvert an intermediate frequency (IF) of a baseband signal to only one of sideband signal center frequencies of $f_{LO}-f_{IF}$ or $f_{IF}+f_{LO}$, without creating an image of the other sideband signal, which is particularly useful when using low IF frequencies, as preselection filtering is difficult in that case. For example, if a desired RF signal is to be generated at frequency $f_{RF}=f_{LO}-f_{IF}$, then the sideband signal (image signal) at $f_{IF}+f_{LO}$ will be suppressed by the sideband suppression provided by the SSB mixer. However, an imbalance in the amplitude of the baseband I and Q signals can result in the presence of relatively high spectral power for the unwanted spectral component at the image frequency.

Furthermore, for differential I/Q schemes which utilize differential analog I signals (I(t), $\overline{I(t)}$) and differential analog Q signals (Q(t), $\overline{Q(t)}$), an imbalance between the differential analog I signals I(t) and $\overline{I(t)}$ and/or an imbalance between the differential analog Q signals Q(t) and $\overline{Q(t)}$, can result in LO leakage. For example, an imbalance between the differential analog baseband signals I(t) and $\overline{I(t)}$ and/or the differential analog baseband signals Q(t) and $\overline{Q(t)}$ can be a DC offset of the baseband analog signals generated by the DAC stage 120. A DC offset between differential baseband signals means that the signals are not completely complementary due to the existence of a DC term. In the mixer stage 140, the DC offset of a complementary baseband signal pair results in a DC term that is multiplied by the LO frequency, so that the output of the mixer stage 140 comprises an unwanted LO frequency component, which would otherwise be suppressed if the differential signals were properly balanced (e.g., zero offset of the differential signals).

The calibration system 190 is configured to perform functions such as (i) generating control signals to configure the RF signal generator system 100 to operate in a calibration mode, (ii) detecting imbalances between the baseband I and Q signals in the I/Q signal paths of the RF signal generator system 100 using DC measurement techniques, (iii) generating DC correction signals in the I/Q signal paths to compensate for detected imbalances between the baseband I and Q signals in the I/Q signal paths of the RF signal generator system 100, and other functions, as discussed in further detail below.

In some embodiments, the current measurement circuitry 192 is configured to measure the I/Q baseband currents in the I/Q signal paths of the RF signal generator system 100, and detect an amount of imbalance, if any, in the I/Q baseband currents, when the RF signal generator system 100 is configured in a calibration mode of operation. For example, in some embodiments, the current measurement circuitry 192 is configured to measure the I and Q baseband currents and detect any imbalance between the I and Q baseband signals. Furthermore, in some embodiments, for a differential I/Q system, the current measurement circuitry 192 is configured to (i) measure the complementary I(t) and $\overline{I(t)}$ baseband currents to detect any imbalance between the complementary I(t) and $\overline{I(t)}$ baseband signals and (ii) measure the complementary Q(t) and $\overline{Q(t)}$ baseband currents to detect any imbalance between the complementary Q(t) and $\overline{Q(t)}$ baseband signals.

The current imbalance correction circuitry 194 is configured to generate DC correction signals in the I/Q signal paths to compensate for detected imbalances between the baseband I and Q signals in the I/Q baseband signal paths of the RF signal generator system 100. In some embodiments, as discussed in further detail below, the current imbalance correction circuitry 194 is configured to inject DC currents into the I/Q baseband signal paths of the RF signal generator system 100 to compensate for detected imbalances between (i) the I and Q baseband currents, (ii) the complementary I(t) and $\overline{I(t)}$ baseband currents, and/or (iii) the complementary Q(t) and $\overline{Q(t)}$ baseband currents.

The calibration control circuitry 196 is configured to perform various functions of the calibration system 190 for calibrating the baseband I/Q signals of the RF signal generator system 100. For example, the calibration control circuitry 196 generates various control signals for configuring the RF signal generator system 100 to operate in a calibration mode to perform calibration processes. In addition, the calibration control circuitry 196 generates control signals to control operation of the current measurement circuitry 192 and the current imbalance correction circuitry 194. Moreover, in some embodiments, the calibration control circuitry 196 comprises control logic that is configured, for example, to (i) process the I/Q baseband current measurement data that is generated by and output from the current measurement circuitry 192 during a calibration process, and generate digital control signals to control the operation of the current imbalance correction circuitry 194 to generate target DC current correction signals based on the results of processing the I/Q baseband current measurements. In some embodiments, the control logic implements a finite state machine to process current measurement data which is output from the current measurement circuitry 192, and generate digital control signals to control operation of the current imbalance correction circuitry 194.

Figure 2:
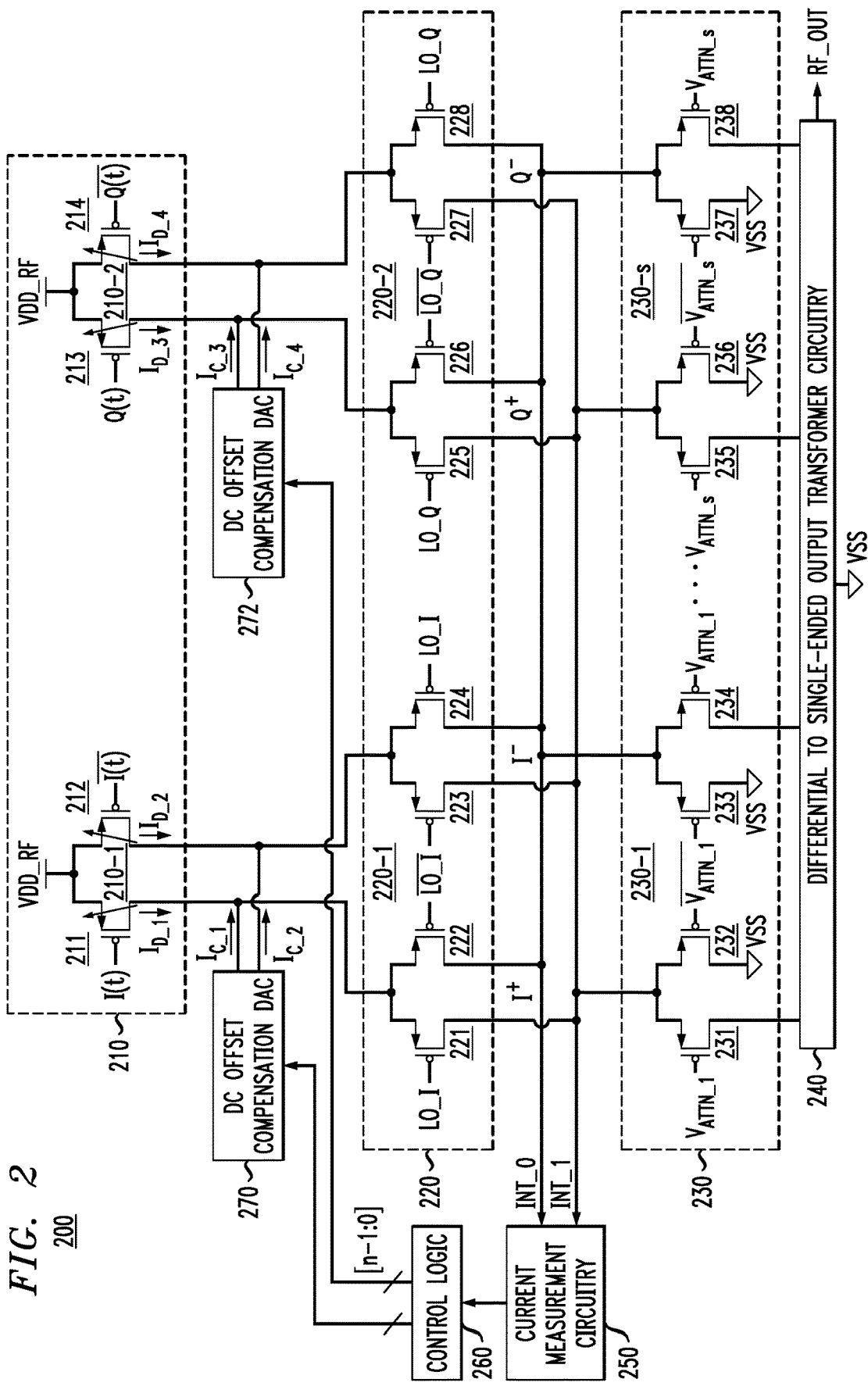
FIG. 2 schematically illustrates a radio frequency signal generator system and a calibration system which is configured to calibrate baseband signals in the radio frequency signal generator system, according to another exemplary embodiment of the disclosure.

FIG. 2 schematically illustrates a radio frequency signal generator system and a calibration system which is configured to calibrate baseband currents in signal paths of the radio frequency signal generator system, according to another exemplary embodiment of the disclosure. More specifically, FIG. 2 schematically illustrates an RF signal generator system 200 comprising a baseband signal input stage 210, a current-commutating mixer stage 220, a signal attenuation stage 230, and transformer circuitry 240 (alternatively, output transformer stage 240). In addition, FIG. 2 schematically illustrates a calibration system comprising current measurement circuitry 250, control logic circuitry 260, a first DC offset compensation DAC 270, and a second DC offset compensation DAC 272.

In some embodiments, the RF signal generator system 200 schematically illustrates a current mode RF signal generator framework which is configured to operate with complementary in-phase baseband signals I(t) and $\overline{I(t)}$, complementary quadrature-phase baseband signals Q(t) and $\overline{Q(t)}$, and complementary quadrature LO signals comprising complementary in-phase LO signals LO_I and $\overline{LO\_I}$, and complementary quadrature-phase LO signals LO_Q and $\overline{LO\_Q}$. In some embodiments, the baseband signal input stage 210 and the current-commutating mixer stage 220 schematically illustrate an exemplary embodiment of the mixer stage 140 of FIG. 1. Further, in some embodiments, the signal attenuation stage 230 schematically illustrates an exemplary embodiment of the amplifier stage 150 of FIG. 1. Moreover, in some embodiments, the output transformer stage 240 represents an exemplary embodiment of the impedance matching network 160 of FIG. 1, wherein the output transformer stage 240 comprises circuitry for transforming a differential output signal to a single-ended output signal. The output transformer stage 240 can be implemented using various techniques and circuit configurations for transforming a differential output signal to a single-ended output signal, which are suitable for the given application and which are well known to those of ordinary skill in the art.

The baseband signal input stage 210 comprises a plurality of baseband input transistors 211, 212, 213, and 214. In some embodiments, the baseband input transistors 211, 212, 213, and 214 are p-type metal-oxide-semiconductor (PMOS) transistors. The transistors 211 and 212 comprise a first differential transistor pair 210-1, wherein the transistors 211 and 212 have source terminals that are commonly connected to a positive supply voltage node VDD (e.g., VDD_RF, where VDD_RF is about 900 mV or less), and respective gate terminals which receive as input the complementary in-phase baseband signals I(t) and $\overline{I(t)}$, respectively. The transistors 213 and 214 comprise a second differential transistor pair 210-2, wherein the transistors 213 and 214 have source terminals that are commonly connected to the positive supply voltage node VDD (e.g., VDD_RF) and respective gate terminals which receive as input the complementary quadrature-phase baseband signals Q(t) and $\overline{Q(t)}$, respectively. The transistors 211, 212, 213, and 214 each comprise a drain terminal that is connected to a respective one of a plurality of differential transistor pairs in the current-commutating mixer stage 220.

In some embodiments, the transistors 211, 212, 213, and 214 of the baseband signal input stage 210 comprise variable gain elements (as schematically illustrated by the slanted arrows across the transistors) which are configurable to adjust the baseband signal gain in the I/Q signal paths. For example, in some embodiments, each baseband input transistor 211, 212, 213, and 214 comprises a variable-width transistor that is structurally configured and controlled using known techniques to vary the effective gate width of the transistor structure and, thus, adjust a maximum amount of drain current $I_{D\_1}$, $I_{D\_2}$, $I_{D\_3}$, and $I_{D\_4}$ that flows through the respective transistors 211, 212, 213, and 214, when operating in saturation mode.

For example, in some embodiments, each baseband input transistor 211, 212, 213, and 214 can be structurally configured to include a plurality of transistor segments that are coupled in parallel, wherein the number of segments that are active/inactive at a given time (via a digital switching control system) can be adjusted to change the effective gate width of a given baseband input transistor. In this regard, the effective widths of the transistors 211, 212, 213, and 214 in the baseband signal input stage 210 can be configured to adjust the baseband signal gain in the I/Q signal paths over a target gain range (e.g., gain range of 20 dB) with multiple gain step settings within the gain range. For example, in some embodiments, DC baseband currents can be adjusted to one of various target current levels over a given range wherein a highest baseband current level is about 10× greater than a lowest baseband current level (e.g., a range from about 35 uA to about 350 uA).

The current-commutating mixer stage 220 comprises a differential I mixer 220-1, and a differential Q mixer 220-2. The differential I mixer 220-1 comprises a plurality of mixing transistors 221, 222, 223, and 224 (alternatively, I mixer switching transistors 221, 222, 223, and 224). The differential Q mixer 220-2 comprises mixing transistors 225, 226, 227, and 228 (alternatively, Q mixer switching transistors 225, 226, 227, and 228). In some embodiments, as shown in FIG. 2, the mixing transistors 221, 222, 223, 224, 225, 226, 227, and 228 are PMOS transistors.

In the differential I mixer 220-1, the mixing transistors 221 and 222 comprise a first differential mixer transistor pair having source terminals that are commonly connected to the drain terminal of the transistor 211 in the baseband signal input stage 210, and respective gate terminals which receive as input the complementary in-phase LO signals LO_I and $\overline{LO\_I}$, respectively. The mixing transistors 223 and 224 comprise a second differential mixer transistor pair having source terminals that are commonly connected to the drain terminal of the transistor 212 in the baseband signal input stage 210, and respective gate terminals which receive as input the complementary in-phase LO signals $\overline{LO\_I}$ and LO_I, respectively.

In the differential Q mixer 220-2, the mixing transistors 225 and 226 comprise a first differential mixer transistor pair having source terminals that are commonly connected to the drain terminal of the transistor 213 in the baseband signal input stage 210, and respective gate terminals which receive as input the complementary quadrature-phase LO signals LO_Q and $\overline{LO\_Q}$, respectively. The mixing transistors 227 and 228 comprise a second differential mixer transistor pair having source terminals that are commonly connected to the drain terminal of the transistor 214 in the baseband signal input stage 210, and respective gate terminals which receive as input the complementary quadrature-phase LO signals $\overline{LO\_Q}$ and LO_Q, respectively.

The current-commutating mixer stage 220 comprises two output nodes, denoted INT_0 and INT_1. As schematically shown in FIG. 2, the mixing transistors 221, 223, 225, and 227 have drain terminals that are commonly coupled to the output node INT_1 of the current-commutating mixer stage 220, and the mixing transistors 222, 224, 226, and 228 have drain terminals that are commonly coupled to the output node INT_0 of the current-commutating mixer stage 220. The differential I mixer 220-1 and the differential Q mixer 220-2 are configured to provide analog I/Q modulation and up-conversion, where the connections of the mixing transistors of the differential I and Q mixers 220-1 and 220-2 (with the mixing transistors operating in triode mode) allow for the summation/subtraction of the output currents of the mixing transistors 221, 222, 223, 224, 225, 226, 227, and 228 to achieve the SSB I/Q modulation, as is understood by those of ordinary skill in the art. As explained in further detail below, in some embodiments, the output nodes INT_0 and INT_1 comprise intermediate nodes of the baseband I and Q signal paths which are tapped by the calibration system to measure I/Q baseband currents of the RF signal generator system 200 during a calibration process.

The signal attenuation stage 230 is configured to adjust a signal strength of the RF output signal. More specifically, in the exemplary embodiment of FIG. 2, the signal attenuation stage 230 is configured to adjust the amount of differential current that flows from the output nodes INT_0 and INT_1 to the output transformer stage 240. In this regard, the signal attenuation stage 230 serves to adjust the signal level of the signal output from the current-commutating mixer stage 220. The signal attenuation stage 230 comprises a plurality of attenuation segments 230-1, . . . , 230-s which are digitally controlled by respective pairs of differential control signals $[V_{ATTN\_1}, \overline{V_{ATTN\_1}}], \ldots [[V_{ATTN\_s}, \overline{V_{ATTN\_s}}]$. As schematically illustrated in FIG. 2, the first attenuation segment 230-1 comprises a first differential pair of transistors 231 and 232, and a second differential pair of transistors 233 and 234. In addition, the attenuation segment 230-s comprises a first differential pair of transistors 235 and 236, and a second differential pair of transistors 237 and 238. In some embodiments, the transistors 231, 232, 233, 234, 235, 236, 237, and 238 of the signal attenuation stage 230 are PMOS transistors. The number (s) of attenuation segments 230-1, . . . , 230-s that are implemented will depend on the desired resolution of gain adjustment.

In the first attenuation segment 230-1, the first differential pair of transistors 231 and 232 have source terminals that are commonly connected to the mixer output node INT_1, and gate terminals that receive as input the differential control signals $V_{ATTN\_1}$ and $\overline{V_{ATTN\_1}}$, respectively. The transistor 231 has a drain terminal that is coupled to the output transformer stage 240, and the transistor 232 has a drain terminal that is coupled to a negative power supply node VSS (e.g., 0V ground voltage). In addition, the second differential pair of transistors 233 and 234 have source terminals that are commonly connected to the mixer output node INT_0, and gate terminals that receive as input the differential control signals $\overline{V_{ATTN\_1}}$ and $V_{ATTN\_1}$, respectively. The transistor 233 has a drain terminal that is coupled to the negative power supply node VSS, and the transistor 234 has a drain terminal that is coupled to the output transformer stage 240.

Similarly, in the attenuation segment 230-s, the first differential pair of transistors 235 and 236 have source terminals that are commonly connected to the mixer output node INT_1, and gate terminals that receive as input the differential control signals $V_{ATTN\_s}$ and $\overline{V_{ATTN\_s}}$, respectively. The transistor 235 has a drain terminal that is coupled to the output transformer stage 240, and the transistor 236 has a drain terminal that is coupled to a negative power supply node VSS. In addition, the second differential pair of transistors 237 and 238 have source terminals that are commonly connected to the mixer output node INT_0, and gate terminals that receive as input the differential control signals $\overline{V_{ATTN\_s}}$ and $V_{ATTN\_s}$, respectively. The transistor 237 has a drain terminal that is coupled to the negative power supply node VSS, and the transistor 238 has a drain terminal that is coupled to the output transformer stage 240.

In operation, the amount of differential current that flows from the output nodes INT_0 and INT_1 to the output transformer stage 240 can be adjusted based on the number of attenuation segments 230-1, . . . , 230-s that are activated. A given attenuation segment is "deactivated" (and does not contribute to attenuation of the RF output signal) when the corresponding differential control signals $V_{ATTN}$ and $\overline{V_{ATTN}}$ are logic "0" and logic "1", respectively. For instance, the first attenuation segment 230-1 will be "deactivated" when $V_{ATTN\_1}$ is logic "0" and $\overline{V_{ATTN\_1}}$ is logic "1" such that the transistors 231 and 234 will be in a turned "On" state and allow some current to flow from the output nodes INT_1 and INT_0 to the output transformer stage 240, while the transistors 232 and 233 will be in a turned "Off" state. On the other hand, the first attenuation segment 230-1 will be "activated" (and will contribute to attenuation of the RF output signal) when $V_{ATTN\_1}$ is logic "1" and $\overline{V_{ATTN\_1}}$ is logic "0" such that the transistors 231 and 234 will be in a turned "Off" state, and the transistors 232 and 233 will be in a turned "On" state and allow some current to flow from the output nodes INT_1 and INT_0 to the negative power supply node VSS (e.g., ground). Since this current flowing from the output nodes INT_1 and INT_0 to the negative power supply node VSS (e.g., ground) does not contribute to the current flowing through the output transformer stage 240, the RF output signal level is reduced.

In this configuration, the amount of differential current that flows from the output nodes INT_0 and INT_1 to the output transformer stage 240 can be (i) increased by increasing the number of "deactivated" attenuation segments (thereby increasing the RF output signal level), or (ii) decreased by increasing the number of "activated" attenuation segments (thereby decreasing the RF output signal level). The number (s) of attenuation segments 230-1, . . . , 230-s that are implemented will depend on the desired resolution of gain adjustment.

As noted above, in the baseband signal input stage 210, the first differential transistor pair 210-1 is configured to receive the complementary in-phase baseband signals I(t) and $\overline{I(t)}$, and the second differential transistor pair 210-2 is configured to receive the complementary quadrature-phase baseband signals Q(t) and $\overline{Q(t)}$, and in response, the first and second differential transistor pairs 210-1 and 210-2 generate current mode signals that are applied to the current-commutating mixer stage 220. In this regard, in the baseband signal input stage 210, matching is critical between the first differential pair of transistors 211 and 212, and between the second differential pair of transistors 213 and 214. In addition, matching is critical between the first differential transistor pair 210-1 and the second differential transistor pair 210-2. In this regard, mismatches between the baseband input transistors in the baseband signal input stage 210 can cause an imbalance in the I/Q baseband current signals, which can lead to LO leakage and insufficient image rejection.

As noted above, an amplitude or phase imbalance between the I and Q signals can cause degradation in the image rejection performance, which leads to the presence of unwanted spur sidebands. Furthermore, an imbalance (e.g., DC offset) between positive and negative components (e.g., $I^+$ and $I^-$) in the same phase (I-phase) leads to an LO leakage spur. In a current mode RF signal generator system architecture (e.g., AWG system) such as shown in FIG. 2, imbalances between (i) the I and Q baseband currents, (ii) the $I^+$ and $I^-$ currents, and/or (iii) the $Q^+$ and $Q^-$ currents, can lead to degraded performance with regard to LO leakage and unwanted spurious sideband signals.

The exemplary calibration system shown in FIG. 2 is configured to correct imbalances in the I/Q baseband currents. As noted above, in some embodiments, the output nodes INT_0 and INT_1 comprise intermediate nodes of the baseband I and Q signal paths which are tapped by the calibration system to measure I/Q baseband currents in the RF signal generator system 200 during a calibration process. In the exemplary embodiment of FIG. 2, the current measurement circuitry 250 comprises first and second inputs that are selectively coupled (via switches) to the respective output nodes INT_0 and INT_1 of the current-commutating mixer stage 220. During a calibration process, the current measurement circuitry 250 is activated and configured to perform DC measurements to sense the individual I-phase and Q-phase current signal components $I^+$, $I^-$, $Q^+$ and $Q^-$ at the output nodes INT_0 and INT_1.

More specifically, in some embodiments, a calibration is performed as follows. The RF signal generator system 200 is configured to operate in calibration mode. In calibration mode, the baseband input transistors 211, 212, 213, and 214 of the baseband signal input stage 210 are biased at their normal current levels (i.e., the same as those used in normal operating mode). The upstream circuitry (such as the first and second DAC circuits 121 and 122 in FIG. 1) is configured (programmed) so that zero differential voltage is applied to the in-phase inputs (I(t) and $\overline{I(t)}$) and to the quadrature-phase inputs (Q(t) and $\overline{Q(t)}$). In addition, the signal attenuation stage 230 is completely turned off by applying a constant DC voltage of the proper logic level to the gate terminals of the transistors in every attenuation segment 230-1, . . . 230-s to turn off all transistors in the signal attenuation stage 230. In this regard, completely turning off the signal attenuation stage 230 causes the DC currents, which are generated by the current-commutating mixer stage 220 during the calibration process and output to the intermediate nodes INT_0 and INT_1, to be routed to the inputs of the current measurement circuitry 250.

Furthermore, in calibration mode, the current-commutating mixer stage 220 can be configured to selectively output a desired one of the baseband currents $I^+$, $I^-$, $Q^+$, or $Q^-$ of a given baseband phase on one of the nodes INT_0 and INT_1 for input to the current measurement circuitry 250. In particular, to selectively output one of the baseband currents $I^+$, $I^-$, $Q^+$, or $Q^-$ at a given time for measurement, the I and Q mixer switching transistors are configured by applying a DC voltage of logic "1" or a DC voltage of logic "0" to the gate terminals of the I and Q mixer switching transistors, as needed, to selectively turn on one mixing transistor, while turning off other mixing transistors.

For example, to output the baseband current $I^+$ on the node INT_1, the mixing transistor 221 of the I mixer 220-1 is turned on, while all other mixing transistors 222, 223, 224, 225, 226, 227, and 228 are turned off. Moreover, to output the baseband current $I^-$ on the node INT_1, the mixing transistor 223 of the I mixer 220-1 is turned on, while all other mixing transistors 221, 222, 224, 225, 226, 227, and 228 are turned off. Further, to output the baseband current $Q^+$ on the node INT_1, the mixing transistor 225 of the Q mixer 220-2 is turned on, while all other mixing transistors 221, 222, 223, 224, 226, 227, and 228 are turned off. Moreover, to output the baseband current $Q^-$ on the node INT_1, the mixing transistor 227 of the Q mixer 220-2 is turned on, while all other mixing transistors 221, 222, 223, 224, 225, 226, and 228 are turned off. It is to be noted that in other embodiments, the individual I-phase and Q-phase current signal components $I^+$, $I^-$, $Q^+$ and $Q^-$ can be selectively output on the nodes INT_0 by selectively activating only one of the mixing transistors 222, 224, 226, or 228, at a given time.

In some embodiments, the current measurement circuitry 250 is configured to measure/estimate the DC baseband currents $I^+$, $I^-$, $Q^+$, and $Q^-$, and the control logic circuitry 260 is configured to determine a difference between the same phase pairs $\{I^+, I^-\}$ and $\{Q^+, Q^-\}$, which provides an indication of DC offset. For example, the difference (imbalance) between the measured I$^+$ and I$^-$ baseband currents and/or the difference (imbalance) between the measured Q$^+$ and Q$^-$ baseband currents, represent DC offsets that lead to LO leakage. In addition, the control logic circuitry 260 is configured to determine a difference (imbalance) between the measured I$^+$ and Q$^+$ baseband currents, wherein an imbalance between the I$^+$ and Q$^+$ baseband currents can degrade image rejection, which results in the presence of unwanted sideband spurs.

The control logic circuitry 260 is configured to generate respective first and second digital control signals (e.g., n-bit control signals [n−1:0]) that are applied to the first and second DC offset compensation DACs 270 and 272, respectively. In some embodiments, the first control signal that is input to the first DC offset compensation DAC 270 provides an indication of the determined difference between the measured I$^+$ and I$^-$ baseband currents, and the second control signal that is input to the second DC offset compensation DAC 272 provides an indication of the determined difference between the measured Q$^+$ and Q$^-$ baseband currents.

As schematically shown in FIG. 2, the first DC offset compensation DAC 270 comprises a first output terminal coupled to the drain terminal of the baseband input transistor 211, and a second output terminal coupled to the drain terminal of the baseband input transistor 212. The second DC offset compensation DAC 272 comprises a first output terminal coupled to the drain terminal of the baseband input transistor 213, and a second output terminal coupled to the drain terminal of the baseband input transistor 214.

In this exemplary configuration, in response to a control signal received from the control logic circuitry 260, the first DC offset compensation DAC 270 is configured to inject additional currents $I_{C\_1}$ and $I_{C\_2}$ into the I$^+$ and I$^-$ baseband signal paths, as needed. The additional currents $I_{C\_1}$ and $I_{C\_2}$ are added to the respective drain currents $I_{D\_1}$ and $I_{D\_2}$ of the respective baseband input transistors 211 and 212 to thereby equalize the I$^+$ and I$^-$ baseband currents and, thus, significantly reduce or eliminate DC offset between the I$^+$ and I$^-$ baseband currents that are applied to the input of the I-mixer 220-1. Similarly, in response to a control signal received from the control logic circuitry 260, the second DC offset compensation DAC 272 is configured to inject additional currents $I_{C\_3}$ and $I_{C\_4}$ into the Q$^+$ and Q$^-$ baseband signal paths, as needed. The additional currents $I_{C\_3}$ and $I_{C\_4}$ are added to the respective drain currents $I_{D\_3}$ and $I_{D\_4}$ of the baseband input transistors 213 and 214 to thereby equalize the Q$^+$ and Q$^-$ baseband currents and, thus, significantly reduce or eliminate DC offset between the Q$^+$ and Q$^-$ baseband currents that are applied to the input of the Q-mixer 220-2.

It is to be noted that imbalances between the baseband currents can be adjusted via the first and second DC offset compensation DACs 270 and 272, and/or the first and second DAC circuits 121 and 122 in FIG. 1. For example, utilizing the first and second DC offset compensation DACs 270 and 272 ensures that any imbalance (offsets) between the two baseband currents corresponding to a given phase, e.g., {I$^+$ and I$^-$}, and {Q$^+$ and Q$^-$} is minimized. On the other hand, the first and second DAC circuits 121 and 122 (FIG. 1) are preferably utilized to correct for an imbalance between the baseband currents I$^+$ and Q$^+$. Thus, utilizing the first and second DC offset compensation DACs 270 and 272, together with the first and second DAC circuits 121 and 122, provides the ability to correct for imbalances and ensures that all baseband currents I$^+$, I$^-$, Q$^+$, and Q$^-$ are essentially equal in magnitude.

Figure 3:
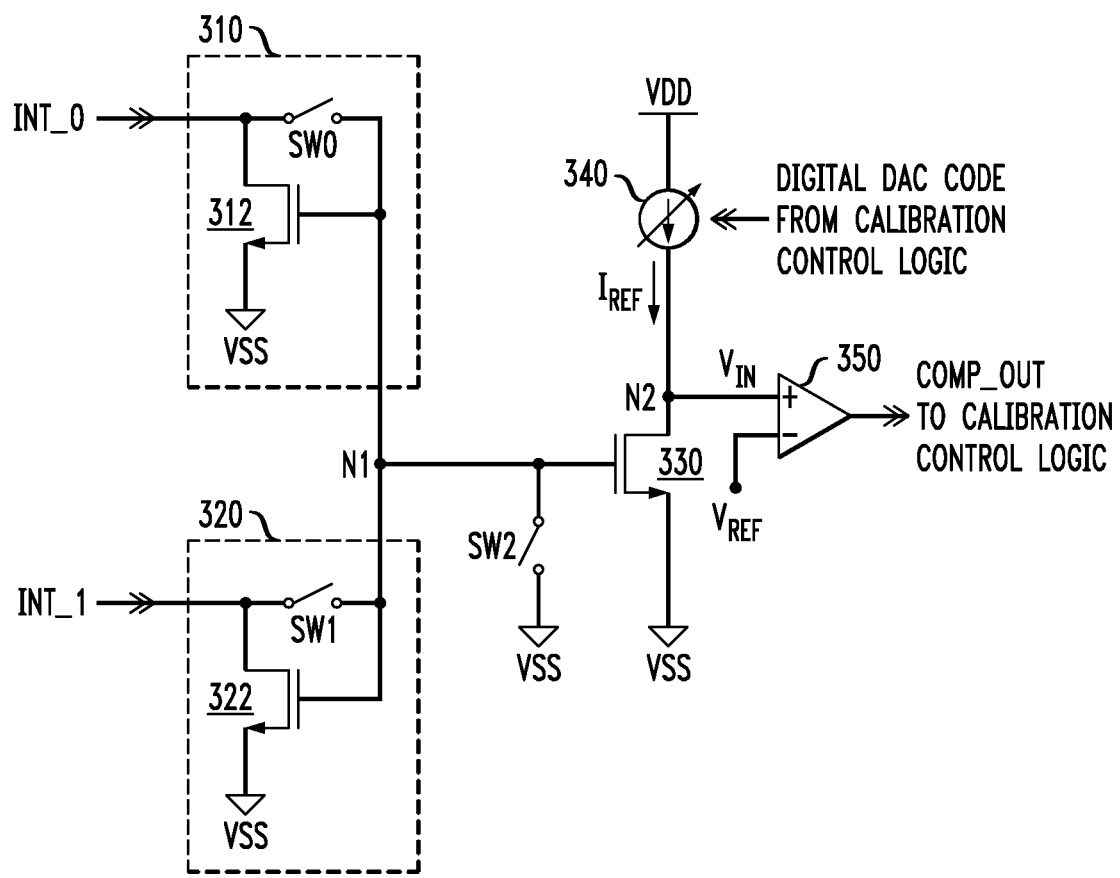
FIG. 3 schematically illustrates current measurement circuitry which is implemented by a calibration system to measure baseband currents, according to an exemplary embodiment of the disclosure.

The current measurement circuitry 250 of FIG. 2 (and the current measurement circuitry 192 of FIG. 1) can be implemented using exemplary techniques and circuit architectures as described herein. For example, FIG. 3 schematically illustrates current measurement circuitry 300 which is implemented by a calibration system to measure baseband currents, according to an exemplary embodiment of the disclosure. The current measurement circuitry 300 comprises a first current sink circuit 310, a second current sink circuit 320, a transistor 330 (alternatively, mirror transistor 330), a current DAC circuit 340, a comparator 350, and a switch SW2. The first current sink circuit 310 comprises a first transistor 312 and a switch SW0. The second current sink circuit 320 comprises a second transistor 322 and a switch SW1. In some embodiments, the transistors 312, 322, and 330 are n-type MOS (NMOS) field-effect transistors.

In the first current sink circuit 310, the first transistor 312 has a drain terminal coupled to a first current sensing node INT_0 (e.g., the intermediate node INT_0 of FIG. 2), a source terminal that is coupled to the negative power supply node VSS, and a gate terminal coupled to a first node N1. The switch SW0 is coupled to and between the drain terminal and the gate terminal of the first transistor 312. Further, in the second current sink circuit 320, the second transistor 322 has a drain terminal coupled to a second current sensing node INT_1 (e.g., the intermediate node INT_1 of FIG. 2), a source terminal that is coupled to the negative power supply node VSS, and a gate terminal coupled to the first node N1. The switch SW1 is coupled to and between the drain terminal and the gate terminal of the second transistor 322.

The mirror transistor 330 comprises a gate terminal that is coupled to the first node N1, a drain terminal that is coupled a second node N2, and a source terminal that is coupled to the negative power supply node VSS. The current DAC circuit 340 comprises an output terminal that is coupled to the second node N2. The comparator 350 (e.g., voltage comparator circuit) comprises a non-inverting input terminal (+) which is coupled to the second node N2, an inverting input terminal (−) which is coupled to a voltage reference node $V_{REF}$, and an output terminal that is coupled to an input terminal of the calibration control circuitry (e.g., block 260, FIG. 2; block 196, FIG. 1). The switch SW2 is coupled to and between the first node N1 and the negative power supply node VSS.

The current DAC circuit 340 comprises a high-resolution current-output DAC which is configured to output a reference current $I_{REF}$ with a magnitude that can be adjusted under digital control by the calibration control circuitry (e.g., block 260, FIG. 2; block 196, FIG. 1, etc.). In some embodiments, the current DAC circuit 340 comprises a segmented DAC framework comprising an N-bit coarse binary-weighted current-output DAC, and a P-bit fine thermometer-coded current-output DAC. An exemplary embodiment of the current DAC circuit 340 will be discussed in further detail below in conjunction with FIGS. 4A, 4B, and 4C.

It is to be noted that the circuit components 310, 320, 330, and 350 of the current measurement circuitry 300 essentially comprise a current comparator circuit which is configured to receive an input baseband current to be measured (from one of the nodes INT_0 or INT_1), compare the input current with a reference current $I_{REF}$ (which is generated and output from the current DAC circuit 340), and generate a compare output signal (denoted Comp_Out). The current DAC circuit 340 is configured to increase or decrease the reference current $I_{REF}$ until the current comparator circuit generates a compare output signal which indicates that a magnitude of the reference current $I_{REF}$ is substantially equal to a magnitude of the input current.

More specifically, during a normal mode of operation of the RF signal generator system, the current measurement circuitry 300 is configured in a deactivated state, wherein the switches SW0 and SW1 are open (deactivated), and the switch SW2 is closed (activated). With the current measurement circuitry 300 in the deactivated state, the first node N1 is coupled to the negative supply voltage node VSS (e.g., ground). Since the gate terminals of the transistors 312, 322, and 330 are commonly coupled to the first node N1, the transistors 312, 322, and 330 are in cutoff mode and, thus, turned off. Further, with the switches SW0 and SW1 deactivated, the first and second nodes INT_0 and INT_1 are disconnected from the first node N1. In the deactivated state, the current measurement circuitry 300 provides a relatively small capacitive load (e.g., small parasitic capacitances of the first and second transistors 312 and 322 in cutoff mode) to the first and second nodes INT_0 and INT_1 of the current-commutating mixer stage 220 to avoid RF signal attenuation.

During a calibration mode, the current measurement circuitry 300 is configured to measure a DC current (e.g., $I^+$, $I^-$, $Q^+$, $Q^-$) on one of first and second output nodes INT_0 and INT_1. For example, to measure a baseband current on the first node INT_0, the switch SW0 is activated (closed), the switch SW1 remains deactivated (open), and the switch SW2 is deactivated (opened). In this configuration, the first current sink circuit 310 is activated where the first transistor 312 becomes a diode-connected MOSFET with its drain and gate terminals coupled together and to the first node N1. In addition, the first transistor 312 (in the diode-connected MOSFET configuration) and the mirror transistor 330 form a current mirror circuit. In some embodiments, the current mirror circuit, which is formed by the first transistor 312 (in the diode-connected configuration) and the mirror transistor 330, is configured to provide a 1:1 current mirror ratio (or current transfer ratio). In other embodiments, the current mirror circuit is configured to scale the input current by a factor of M, where M<1 or where M>1.

In calibration mode, the RF signal generator system is configured so that a DC current, which corresponds to one of the $I^+$, $I^-$, $Q^+$, or $Q^-$ baseband currents, flows from the first node INT_0 into the first current sink circuit 310 and through the first transistor 312. The current DAC circuit 340 outputs a reference current $I_{REF}$ that flows through the mirror transistor 330, and a voltage (denoted $V_{IN}$) is generated on the second node N2 which is applied to the non-inverting input (+) terminal of the comparator 350. In some embodiments, a reference voltage $V_{REF}=0.5*VDD$ is applied to the inverting input (−) terminal of the comparator 350. When the voltage $V_{IN}$ on the second node N2 is greater than $V_{REF}$, the output of the comparator 350 will be at a logic "1" level. When the voltage $V_{IN}$ on the second node N2 is less than $V_{REF}$, the output of the comparator 350 will be at a logic "0" level. In this exemplary configuration, the high output impedance of the node N2 is well suited for performing the comparison operation.

In operation, the DC baseband current which is being measured flows from the first node INT_0 into the first current sink circuit 310, and a DC reference current (denoted $I_{REF}$), which corresponds to a given digital DAC code, is output from the current DAC circuit 340. If the DAC reference current is greater than the DC baseband current, the voltage $V_{IN}$ generated on the second node N2 will be greater than $V_{REF}$, which causes the output of the comparator 350 to be at logic "1" level. In response to the logic "1" output from the comparator 350, the calibration control logic will determine that the DC baseband current which is being measured is less than the DAC reference current and, in response, will generate a control code to cause the current DAC circuit 340 to reduce the DAC reference current.

On the other hand, if the DAC reference current is less than the DC baseband current, the voltage $V_{IN}$ generated on the second node N2 will be less than $V_{REF}$, which causes the output of the comparator 350 to be at logic "0" level. In response to the logic "0" output from the comparator 350, the calibration control logic will determine that the DC baseband current which is being measured is greater than the DAC reference current and, in response, will generate a control code to cause the current DAC circuit 340 to increase the DAC reference current.

In the exemplary configuration, the comparison results at the output of the comparator 350 are tracked by the calibration control logic as the DAC reference current $I_{REF}$ is adjusted (either increased or decreased). When the output of the comparator 350 toggles from 0→1 or from 1→0, this provides an indication that the latest DAC code corresponds to the DAC reference current $I_{REF}$ which is equal to, or substantially equal to, the DC baseband current that is being measured. In other words, the current DAC circuit 340 is adjusted to find a DAC code which makes the DAC reference current $I_{REF}$ to be as close as possible to the DC baseband current that is being measured, wherein the final code setting of the current DAC circuit 340 will provide an estimate of the magnitude of the DC baseband current.

Furthermore, in a similar manner, to measure a baseband current on the second node INT_1, the switch SW1 is activated (closed), the switch SW0 is deactivated (opened), and the switch SW2 is deactivated (opened). In this configuration, the second current sink circuit 320 is activated where the second transistor 322 becomes a diode-connected MOSFET with its drain and gate terminals coupled together and to the first node N1. In addition, the second transistor 322 (in the diode-connected MOSFET configuration) and the mirror transistor 330 form a current mirror circuit. In some embodiments, the current mirror circuit, which is formed by the second transistor 322 (in the diode-connected configuration) and the mirror transistor 330, is configured to provide a 1:1 current mirror ratio. In other embodiments, the current mirror circuit is configured to scale the input current by a factor of M, where M<1 or where M>1. In some embodiments, the current mirror circuit formed by the second transistor 322 (in the diode-connected configuration) and the mirror transistor 330 is configured to provide the same current mirror ratio as the current mirror circuit formed by the first transistor 312 (in the diode-connected configuration) and the mirror transistor 330.

In calibration mode, the RF signal generator system is configured so that a DC current, which corresponds to one of the $I^+$, $I^-$, $Q^+$, or $Q^-$ baseband currents, flows from the second node INT_1 into the second current sink circuit 320 and through the second transistor 322. The current measurement circuitry 300 compares the DC baseband current (being measured) with different DAC reference currents using the same process as discussed above to determine a DAC reference current $I_{REF}$ which is equal to, or substantially equal to, the DC baseband current that is being measured. An exemplary calibration process will be discussed in further detail below in conjunction with, e.g., FIGS. 5, 6, 7A, and 7B.

The current DAC circuit 340 may be implemented using any high-resolution current-output DAC architecture, which is suitable for the given application. The general function of the current DAC circuit 340 is to convert a digital input code (provided from the calibration control logic) to an analog current (e.g., DAC reference current $I_{REF}$) which is output from the current DAC circuit 340. As is known in the art, a current mode DAC architecture replicates a reference current source in each branch of the DAC, wherein the current sources are connected parallel to each other. In addition, the current sources are connected to an output node via respective MOSFET switches which are controlled by the digital input code. Each branch current is switched off or on based on the digital input code, and the current output from each activated branch of the DAC is summed to generate the analog output current.

In some embodiments, as noted above, the current DAC circuit 340 comprises a segmented DAC framework comprising a coarse binary-weighted DAC segment, and a fine thermometer-coded DAC segment, which allows the analog output current of the current DAC circuit 340 to be digitally programmed using coarse bits and fine bits. The coarse binary-weighted DAC segment is utilized to generate an output current close to a target current level (e.g., the baseband current being measured), while the fine thermometer-coded DAC segment is utilized for fine-tune adjustment of the output current to converge closer to the target current level. It is to be noted that the current DAC circuit 340 can be designed with relaxed requirements in that, e.g., the least significant bit (LSB) size of the fine thermometer-coded DAC segment does not have to be critically related to the LSB size of the coarse binary-weighted DAC segment.

More specifically, since the current measurement circuitry 300 is configured as a current comparator circuit which compares the input baseband current to be measured with the DAC reference current $I_{REF}$, and adjusts the magnitude of the DAC reference current $I_{REF}$ until the DAC reference current $I_{REF}$ is determined to be equal or substantially equal to a magnitude of the input baseband current being measured, there is no requirement for correlating/calibrating the LSB sizes of the coarse and fine DAC segments. The coarse DAC segment is utilized to set the magnitude of the DAC reference current $I_{REF}$ within a tuning range of the fine DAC segment, while the fine DAC segment is utilized to fine tune the magnitude of the DAC reference current $I_{REF}$ to converge as close as possible to the magnitude of the baseband current being measured. As long as the coarse DAC segment can be used to set the magnitude of the DAC reference current $I_{REF}$ within the tuning range of the fine DAC segment, the DC baseband currents (e.g., $I^+$, $I^-$, $Q^+$, $Q^-$) can be compared against each other with high precision (resolution) by means of the current measurement circuitry 300.

Furthermore, in some embodiments, the current DAC circuit 340 is configured to have a programmable range control which is commensurate with the range of gain settings of the baseband signal input stage 210 (FIG. 2). As noted above, in the exemplary embodiment of FIG. 2, the effective widths of the transistors 211, 212, 213, and 214 of the baseband signal input stage 210 can be adjusted to increase or decrease the baseband current levels in the I/Q signal paths over a given range, where a highest baseband current level (e.g., 350 uA) is about 10× greater than a lowest baseband current level (e.g., 35 uA). In this regard, the current measurement range of the current measurement circuitry 300 can be scaled to match the baseband current levels that are generated by the baseband signal input stage 210.

For example, in some embodiments, the current DAC circuit 340 is configured to operate over the full range of baseband current levels that can be generated by the baseband signal input stage 210. The current DAC circuit 340 comprises a scaling tuning knob (e.g., a pre-scaler adjustment knob) to scale the current DAC circuit 340 to generate output current levels that are commensurate with the baseband current levels in the I/Q signals paths, which are generated for a given gain step setting of the baseband signal input stage 210. In some embodiments, the scaling of the current DAC circuit 340 is configured to track the scaling of the baseband signal input stage 210 using control signals that are "ganged" together such that when the gain of the baseband signal input stage 210 is adjusted, the DAC current output range of the current DAC circuit 340 is automatically scaled so that the current measurement range of the current measurement circuitry 300 is commensurate with the adjusted I/Q baseband current levels.

In some embodiments, the current DAC circuit 340 can be configured to enable scaling of the LSB size of the coarse DAC segment and/or the fine DAC segment. For example, if the baseband current levels increase or decrease by a given amount due to a change in the baseband gain setting, the LSB current can be adjusted by the same amount to scale the current output range of the current DAC circuit 340. The LSB size can be scaled using known techniques. For example, in embodiments wherein a DAC segment comprises an array of current sources which are biased using a current mirror having a diode-connected transistor coupled to mirror transistors (current sources) in the various DAC cells, the effective width of the diode-connected transistor can be scaled (increased or decreased) to change the current mirror ratio, and thus, change the amount of current generated by the mirror transistors. For example, if the effective width of the diode-connected transistor of the current mirror increases by a factor of 2 (2×), the amount of current generated by the mirror transistors (current sources) decreases by 2×.

Figure 4A:
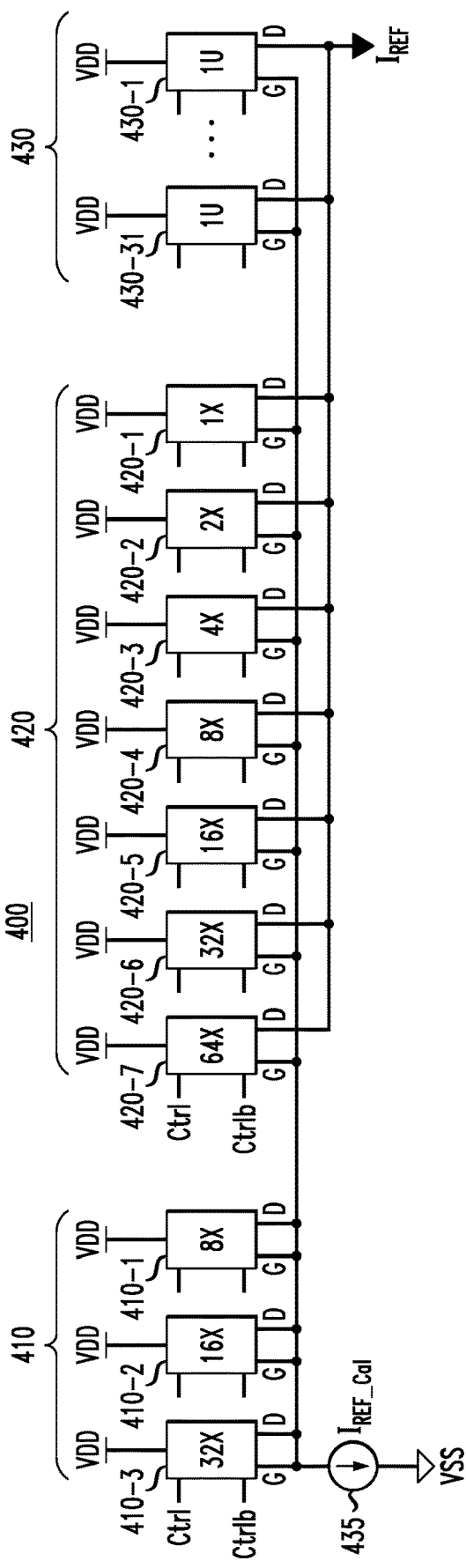
FIGS. 4A, 4B, and 4C schematically illustrate a current mode digital-to-analog converter circuit which can be implemented in the current measurement circuitry of FIG. 3, according to an exemplary embodiment of the disclosure.
Figure 4C:
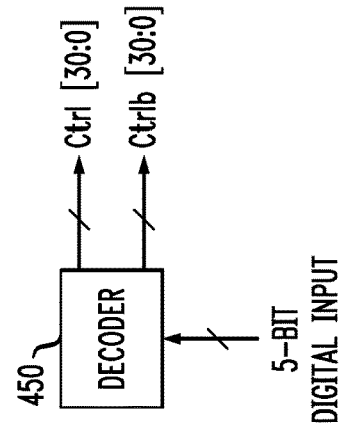
Figure 4B:
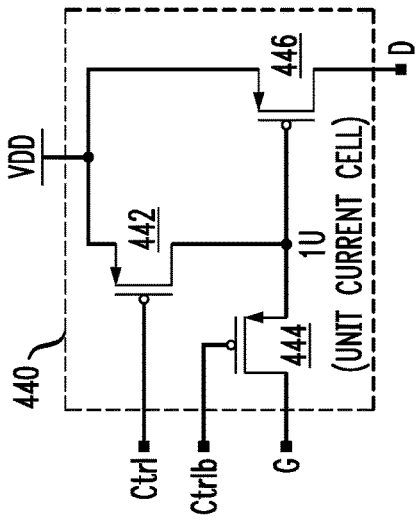

FIGS. 4A, 4B, and 4C schematically illustrate a current mode DAC 400 which can be implemented in the current measurement circuitry 300 of FIG. 3, according to an exemplary embodiment of the disclosure. As shown in FIG. 4A, the current mode DAC 400 comprises a segmented DAC architecture comprising a prescaler DAC segment 410, a coarse DAC segment 420, a fine DAC segment 430, and a current source 435. The prescaler DAC segment 410 comprises a plurality (e.g., 3) of adjustable (i.e., selectable) diode-connected transistors 410-1, 410-2, and 410-3. The coarse DAC segment 420 comprises a plurality (e.g., 7) of current sources 420-1, 420-2, 420-3, 420-4, 420-5, 420-6, and 420-7. The fine DAC segment 430 comprises a plurality (e.g., 31) of current sources 430-1, ..., 430-31. The current source 435 generates an input current (denoted $I_{REF\_Cal}$) which sets the current through the diode-connected transistors 410-1, 410-2, and 410-3 of the prescaler DAC segment 410.

The prescaler DAC segment 410 operates as a diode-connected transistor that is used to develop a bias voltage for the DAC cells, with a width that is programmable with M-bit (e.g., M=3) resolution. The programmable width can be used to prescale the current output level of the current mode DAC 400 based on the gain setting of the baseband signal input stage 210. In some embodiments, the coarse DAC segment 420 comprises an N-bit (e.g., N=7) binary-weighted current DAC, and the fine DAC segment 430 comprises a P-bit (e.g., P=5) thermometer-coded current DAC (also referred to as unary-weighted). The output current of the current mode DAC 400 is a sum of the current outputs from the coarse DAC segment 420 and the fine DAC segment 430. For a given baseband gain setting, the setting of the prescaler DAC segment 410 remains fixed, while the current outputs of the coarse DAC segment 420 and fine DAC segment 430 are dynamically adjusted via digital control to adjust the magnitude of the DAC output current (e.g., reference current $I_{REF}$, FIG. 3) to match the magnitude of the baseband current being measured.

In some embodiments, the DAC segments 410, 420, and 430 utilize a same unit current cell to reduce mismatches between the currents of the DAC segments 410, 420, and 430. FIG. 4B schematically illustrates a unit current cell (1U) 440 according to an exemplary embodiment of the disclosure, which is utilized to implement the respective unit cells of the DAC segments 410, 420, and 430. The unit current cell 440 comprises PMOS transistors 442, 444, and 446. The PMOS transistor 442 comprises a gate terminal that is coupled to a first control node Ctrl, a source terminal coupled to the positive power supply node VDD, and a drain terminal that is coupled to a gate terminal of the PMOS transistor 446. The PMOS transistor 444 comprises a gate terminal that is coupled to a second control node Ctrlb, a source terminal coupled to the gate terminal of the PMOS transistor 446, and a drain terminal coupled to a node G, which is a gate bias voltage node for the current mode DAC 400. The PMOS transistor 446 comprises a source terminal coupled to the positive power supply node VDD, and a drain terminal coupled to a current output node D. The control terminals Ctrl and Ctrlb receive complementary controls which enable or disable the unit cell.

As shown in FIG. 4A, the prescaler DAC segment 410 is configured to provide an adjustable reference current mirror circuit, wherein gate (G) and drain (D) terminals are connected to form an adjustable diode-connected transistor that is biased by a reference current $I_{REF\_Cal}$. In some embodiments, each adjustable diode-connected transistor 410-1, 410-2, and 410-3 of the prescaler DAC segment 410 comprises a plurality of the unit current cells 440 of FIG. 4B connected in parallel. For example, in some embodiments, the smallest (e.g., least significant bit, 8×) adjustable diode-connected transistor 410-1 of the prescaler DAC segment 410 comprises eight (8) unit current cells 440 connected in parallel, and the remaining adjustable diode-connected transistors 410-2 and 410-3 are weighted by having an increasing number of the unit current cells 440. For example, the adjustable diode-connected transistor 410-2 (16×) comprises 16 of the unit current cells 440 connected in parallel, and so on.

Further, each current source 420-1, 420-2, 420-3, 420-4, 420-5, 420-6, and 420-7 of the coarse DAC segment 420 comprises a plurality of the unit current cells 440 of FIG. 4B connected in parallel. For example, in some embodiments, the smallest (e.g., least significant bit, 1×) current source 420-1 of the coarse DAC segment 420 comprises eight (8) unit current cells 440 connected in parallel, and the remaining binary-weighted current sources 420-2, 420-3, 420-4, 420-5, 420-6, and 420-7 have an increasing amount of the unit current cells 440. For example, the current source 420-2 (2×) comprises sixteen (16) of the unit current cells 440 connected in parallel, and so on.

Moreover, in some embodiments, each current source 430-1, . . . , 430-31 of the fine DAC segment 430 comprises a single unit current cell 440 (1U). This configuration provides a 4× overlap (2 bits) between the binary-weighted coarse DAC segment 420 and the thermometer-coded fine DAC segment 430, enabling a 10-bit resolution for the current mode DAC 400, e.g., 7 bits (coarse DAC)+5 bits (fine DAC)−2 bits (overlap)=10 bits. In this exemplary configuration, while a 10-bit resolution is realized, a 12-bit control signal is applied to the current mode DAC 400 to take advantage of the 4× overlap and not depend on matching the LSB sizes of the coarse and fine DAC segments 420 and 430. As shown in FIG. 4C, the 5-bit digital control signal for the fine DAC segment 430 is input to a decoder 450 to generate a 31-bit control signal Ctrl [30:0] and a 31-bit complementary control signal Ctrlb [30:0], to selectively activate respective current sources 430-1, . . . , 430-31 of the thermometer-coded fine DAC segment 430.

As noted above, the LO signal output configuration circuitry 180 (FIG. 1) comprises LO signal driver stages which are configured to drive the LO inputs of the first and second mixer circuits 141 and 142 in the mixer stage 140 with either (i) quadrature LO signals to perform I/Q modulation (in normal mode) or (ii) DC voltages that are configured to selectively activate and deactivate switching transistors of the first and second mixer circuits 141 and 142 to perform DC measurements of baseband currents (in calibration mode). An exemplary embodiment of the LO signal output configuration circuitry 180 is shown in FIG. 5.

Figures 5, 6:
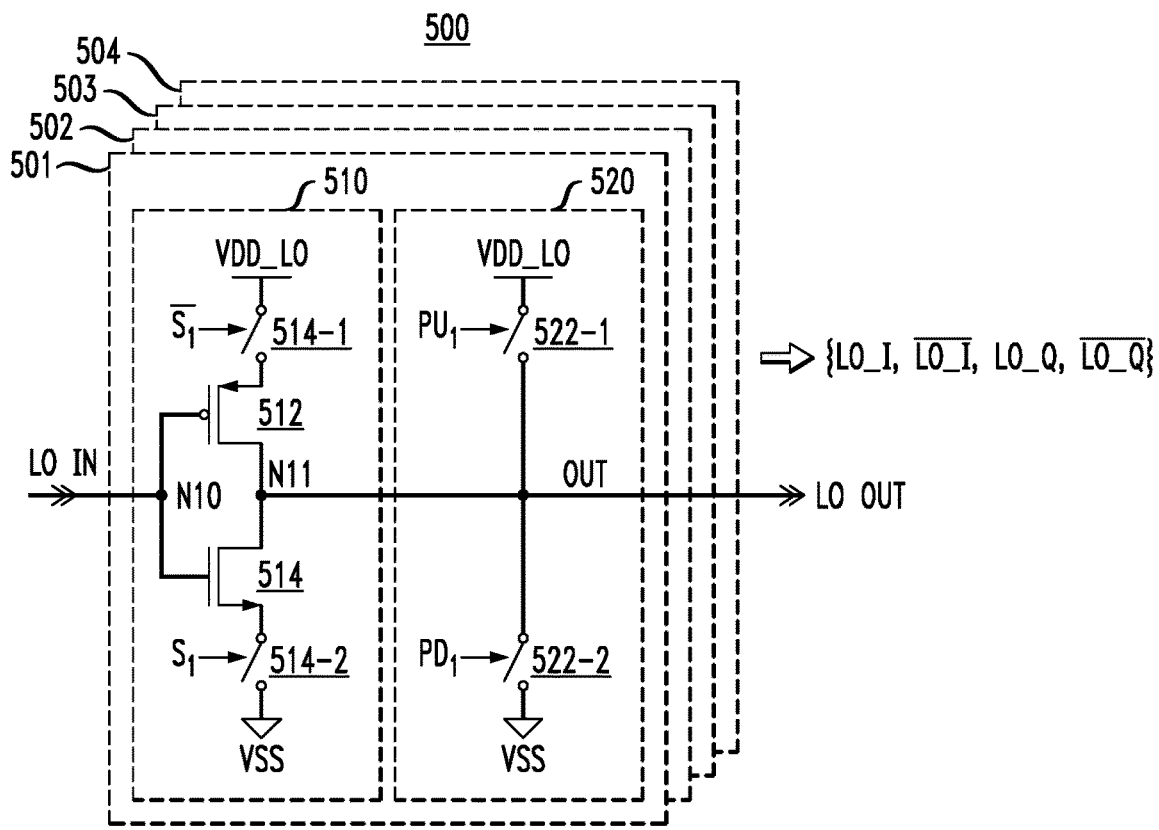
FIG. 5 schematically illustrates a local oscillator signal output configuration circuit, according to an exemplary embodiment of the disclosure.
FIG. 6 illustrates a table of settings for configuring a radio frequency signal generator system and calibration system in a calibration mode to measure individual baseband currents, according to an exemplary embodiment of the disclosure.

FIG. 5 schematically illustrates an LO signal output configuration circuit 500, according to an exemplary embodiment of the disclosure. The LO signal output configuration circuit 500 comprises a plurality of LO driver stages 501, 502, 503, and 504, which are configured to drive respective phases of the quadrature LO signals LO_I, LO_Q, $\overline{\text{LO\_I}}$, and $\overline{\text{LO\_Q}}$ (e.g., respective phases 0°, 90°, 180°, and 270°) for I/Q modulation when operating in a normal mode, as well as generate DC voltages equal to either (i) a positive power supply node voltage (e.g., VDD_LO, which can be lower than VDD_RF (FIG. 2)) or (ii) the negative power supply node VSS voltage (e.g., 0 V), when operating in calibration mode.

More specifically, as shown in FIG. 5, the first LO driver stage 501 comprises a buffer stage 510, and an output configuration stage 520. The buffer stage 510 comprises a CMOS inverter which comprises a PMOS transistor 512 and an NMOS transistor 514, which are serially connected between the positive supply voltage node VDD_LO and the negative supply voltage node VSS. A source terminal of the PMOS transistor 512 is selectively connected to the positive supply voltage node VDD_LO through a first switch 514-1. A source terminal of the NMOS transistor 514 is selective connected to the negative supply voltage node VSS through a second switch 514-2. The PMOS and NMOS transistors 512 and 514 have commonly connected gate terminals which are coupled to an input node N10 of the first LO driver stage 501. The PMOS and NMOS transistors 512 and 514 have commonly connected drain terminals which are connected to an output node N11 of the CMOS inverter.

In some embodiments, the first switch 514-1 comprises a PMOS transistor which is controlled by a switch control signal $\overline{S_1}$ that is applied to a gate terminal thereof, and the second switch 514-2 comprises an NMOS transistor which is controlled by a switch control signal $S_1$ that is applied to a gate terminal thereof. In some embodiments, the switch control signals $S_1$ and $\overline{S_1}$ comprise a complementary pair of digital control signals such the first and second switches 514-1 and 514-2 are concurrently controlled. For example, when $S_1$ is asserted to a logic "1" level, $\overline{S_1}$ is asserted to a logic "0" level, and both switches 514-1 and 514-2 will be turned on (closed). On the other hand, when $S_1$ is asserted to a logic "0" level, $\overline{S_1}$ is asserted to a logic "1" level, and both switches 514-1 and 514-2 will be turned off (open).

In some embodiments, as shown in FIG. 5, the buffer stage 510 comprises a single CMOS inverter stage, wherein the output node N11 of the CMOS inverter is coupled to, or comprises, the output node OUT of the first LO driver stage 501. In other embodiments, the buffer stage 510 is implemented by cascading two CMOS inverters, wherein the output node N11 of the CMOS inverter is connected to an input node of a second CMOS inverter, and wherein the output node of the second CMOS inverter is coupled to, or comprises, the output node OUT of the first LO driver stage 501. As is known in the art, the cascaded combination of two CMOS inverters brings the input LO signal back to the original phase.

The output configuration stage 520 comprises a first switch 522-1 and a second switch 522-2. The first switch 522-1 is coupled between the positive power supply node VDD_LO and the output node OUT of the first LO driver stage 501. The second switch 522-2 is coupled between the negative power supply node VSS and the output node OUT of the first LO driver stage 501. In some embodiments, the first switch 522-1 comprises a PMOS transistor which is controlled by a switch control signal $PU_1$ (or pull-up control signal) that is applied to a gate terminal thereof, and the second switch 522-2 comprises an NMOS transistor which is controlled by a switch control signal $PD_1$ (or pull-down control signal) that is applied to a gate terminal thereof.

In a normal mode of operation, the first LO driver stage 501 is configured to drive one of the phases of the quadrature LO signals LO_I, LO_Q, $\overline{LO\_I}$, and $\overline{LO\_Q}$. In particular, in normal mode, the buffer stage 510 is activated by asserting the switch control signals $S_1$ and $\overline{S_1}$ to activate (close) the first switch 514-1 and the second switch 514-2, while the output configuration stage 520 is maintained in a deactivated state by applying the pull-up and pull-down control signals $PU_1$ and $PD_1$ to deactivate (open) the first switch 522-1 and the second switch 522-2. In this configuration, the first LO driver stage 501 drives an LO input signal, LO In, that is applied to the input node N10 of the buffer stage 510, and outputs a switching LO signal, LO Out, (rail-to-rail switching) having the target LO frequency (e.g., 5 GHz).

On the other hand, in a calibration mode of operation, the first LO driver stage 501 is configured to output a DC LO signal at logic "0" level or a logic "1" level. In particular, in calibration mode, the buffer stage 510 is deactivated by de-asserting the switch control signals $S_1$ and $\overline{S_1}$ to deactivate (open) the first switch 514-1 and the second switch 514-2, while the output configuration stage 520 is activated by applying the pull-up and pull-down control signals $PU_1$ and $PD_1$ to activate one of the first and second switches 522-1 and 522-2. For example, the first LO driver stage 501 can be configured to output a DC voltage at a logic "1" level by activating the first switch 522-1 and pulling up the output node OUT to the positive supply rail voltage VDD_LO (e.g., 0.9 V), keeping the second switch 522-2 deactivated. Alternatively, the first LO driver stage 501 can be configured to output a DC voltage at a logic "0" level by activating the second switch 522-2 and pulling down the output node OUT to the negative supply rail voltage VSS (e.g., 0V), while keeping the first switch 522-1 deactivated.

It is to be understood that while FIG. 5 depicts the exemplary circuit configuration of the first LO driver stage 501 for ease of illustration, the second LO driver stage 502, the third LO driver stage 503, and the fourth LO driver stage 504 have the same circuit configuration, and operate in a similar manner, as the first LO driver stage 501, where in an exemplary embodiment, the first LO driver stage 501 is configured to drive LO_I, the second LO driver stage 502 is configured to drive $\overline{LO\_I}$, the third LO driver stage 503 is configured to drive LO_Q, and the fourth LO driver stage 504 is configured to drive $\overline{LO\_Q}$. However, the different LO driver stages 501, 502, 503, and 504 are individually controlled with respective control signals $S_x$, $\overline{S_x}$ and $PU_x$, $PD_x$, where x=1, 2, 3, 4. The individual driver stage control signals $S_x$, $\overline{S_x}$ and $PU_x$, $PD_x$ allow the LO driver stages 501, 502, 503, and 504 to be individually controlled, as needed, to configure the LO signal output configuration circuit 500 for normal and calibration modes of operation.

For example, FIG. 6 illustrates a table 600 of settings for configuring an RF signal generator system and calibration system in a calibration mode to measure individual baseband currents, according to an exemplary embodiment of the disclosure. In particular, FIG. 6 illustrates how different states of the first and second switches SW0 and SW1 (of the current measurement circuitry 300, FIG. 3) and different DC voltages of the quadrature LO signals LO_I, $\overline{LO\_I}$, LO_Q, and $\overline{LO\_Q}$ (which are programmatically generated by the LO signal output configuration circuit 500, FIG. 5) can be set to measure the individual baseband currents $I^+$, $I^-$, $Q^+$, and $Q^-$ generated on the first and second output nodes INT_0 and INT_1 of the current-commutating mixer stage 220 (FIG. 2), according to an exemplary embodiment of the disclosure.

As collectively shown in FIGS. 2, 3 and 5, in calibration mode, the baseband current $I^+$ can be measured on either (i) the second output node INT_1 by applying an LO_I signal with a DC voltage of logic "0" (Low) to the I mixer 220-1 (with each of $\overline{LO\_I}$, LO_Q and $\overline{LO\_Q}$ set to a DC voltage of logic "1" (High), and activating the switch SW1 (with the switch SW0 deactivated), or (ii) the first output node INT_0 by applying an $\overline{LO\_I}$ signal with a DC voltage of logic "0" to the I mixer 220-1 (with each of LO_I, LO_Q and $\overline{LO\_Q}$ set to a DC voltage of logic "1"), and activating the switch SW0 (with the switch SW1 deactivated). Further, in calibration mode, the baseband current $I^-$ can be measured on either (i) first output node INT_0 by applying an LO_I signal with a DC voltage of logic "0" to the I mixer 220-1 (with each of $\overline{LO\_I}$, LO_Q and $\overline{LO\_Q}$ set to a DC voltage of logic "1"), and activating the switch SW0 (with the switch SW1 deactivated), or (ii) the second output node INT_1 by applying an $\overline{LO\_I}$ signal with a DC voltage of logic "0" to the I mixer 220-1 (with each of LO_I, LO_Q and $\overline{LO\_Q}$ set to a DC voltage of logic "1"), and activating the switch SW1 (with the switch SW0 deactivated).

Moreover, in calibration mode, the baseband current $Q^+$ can be measured on either (i) the second output node INT_1 by applying an LO_Q signal with a DC voltage of logic "0" to the Q mixer 220-2 (with each of LO_I, $\overline{LO\_I}$, and $\overline{LO\_Q}$ set to a DC voltage of logic "1"), and activating the switch SW1 (with the switch SW0 deactivated), or (ii) the first output node INT_0 by applying an $\overline{LO\_Q}$ signal with a DC voltage of logic "0" to the Q mixer 220-2 (with each of LO_I, $\overline{LO\_I}$, and LO_Q set to a DC voltage of logic "1"), and activating the switch SW0 (with the switch SW1 deactivated), Further, in calibration mode, the baseband current $Q^-$ can be measured on either (i) the first output node INT_0 by applying an LO_Q signal with a DC voltage of logic "0" to the Q mixer 220-2 (with each of LO_I, $\overline{LO\_I}$, and $\overline{LO\_Q}$ set to a DC voltage of logic "1"), and activating the switch SW0 (with the switch SW1 deactivated), or (ii) on the second output node INT_1 by applying an $\overline{LO\_Q}$ signal with a DC voltage of logic "0" to the Q mixer 220-2 (with each of LO_I, $\overline{LO\_I}$, and LO_Q set to a DC voltage of logic "1"), and activating the switch SW1 (with the switch SW0 deactivated).

It is to be noted that the exemplary table 600 shown in FIG. 6 illustrates different switch configurations in calibration mode for measuring the individual DC baseband currents $I^+$, $I^-$, $Q^+$, and $Q^-$, one at a time. In other embodiments, the sum of two DC baseband currents (e.g., $I^+ + Q^+$) can be measured at a given time by concurrently activating a mixer transistor in the I mixer 220-1 and a mixer transistor in the Q mixer 220-2 at a given time. It is to be further noted that the current measurement circuitry 300 of FIG. 3 coupled to both output nodes INT_0 and INT_1 of the current-commutating mixer stage 220 provides equalized loading on both output nodes INT_0 and INT_1 during the normal mode of operation of the RF signal generator system (when the calibration circuitry is deactivated). Furthermore, while the same baseband current (e.g., $I^+$) can be measured on either one of the nodes INT_0 and INT_1, in some embodiments, a calibration process is configured to measure the same baseband current, individually, on both nodes INT_0 and INT_1 for better accuracy, e.g., measuring the baseband current $I^+$ on the node INT_0, measuring the baseband current $I^+$ on the node INT_1, and computing an average of the two baseband current measurements.

Figure 7A:
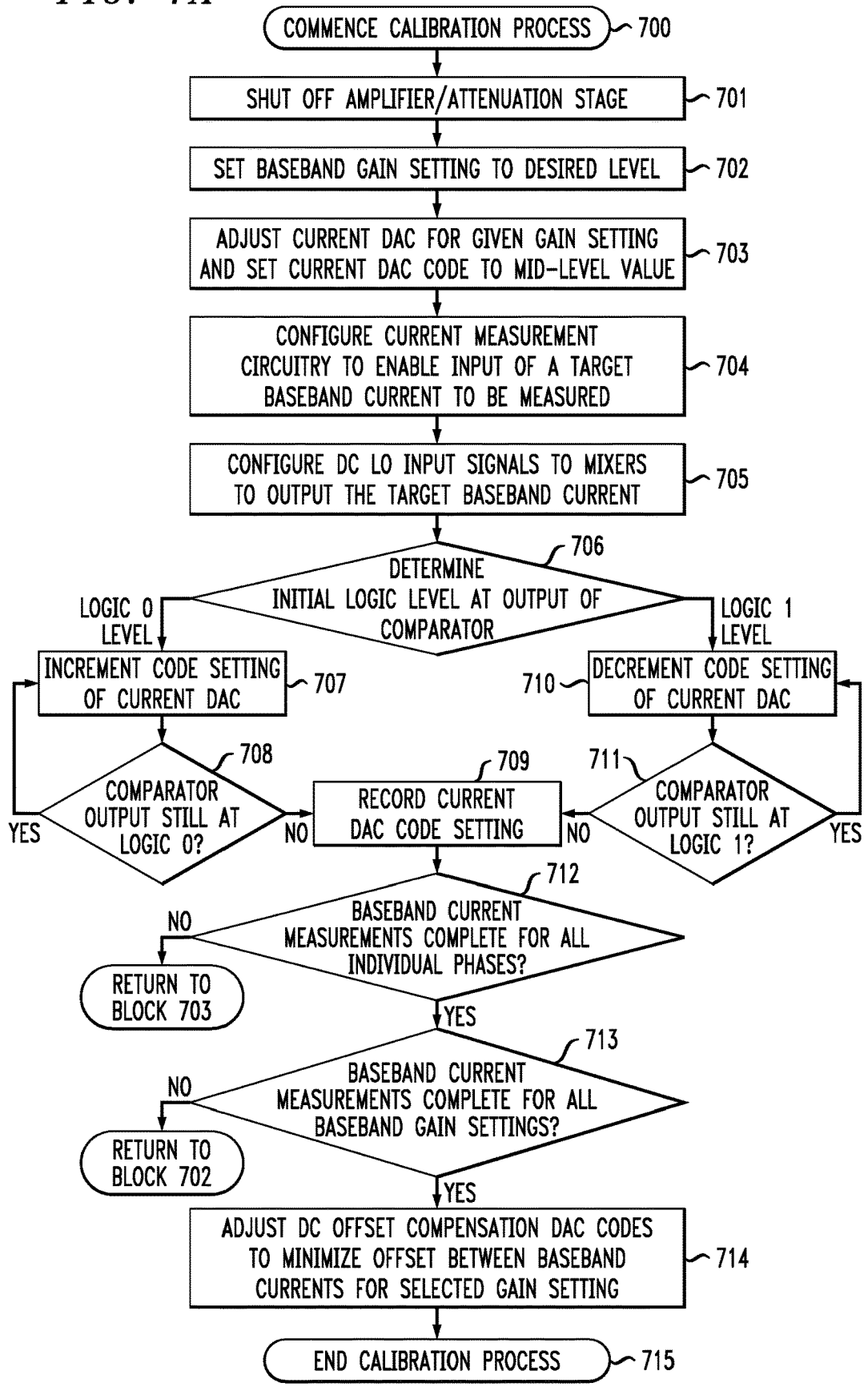
FIGS. 7A and 7B illustrate a process for calibrating baseband currents in a radio frequency signal generator system, according to an exemplary embodiment of the disclosure.
Figure 7B:
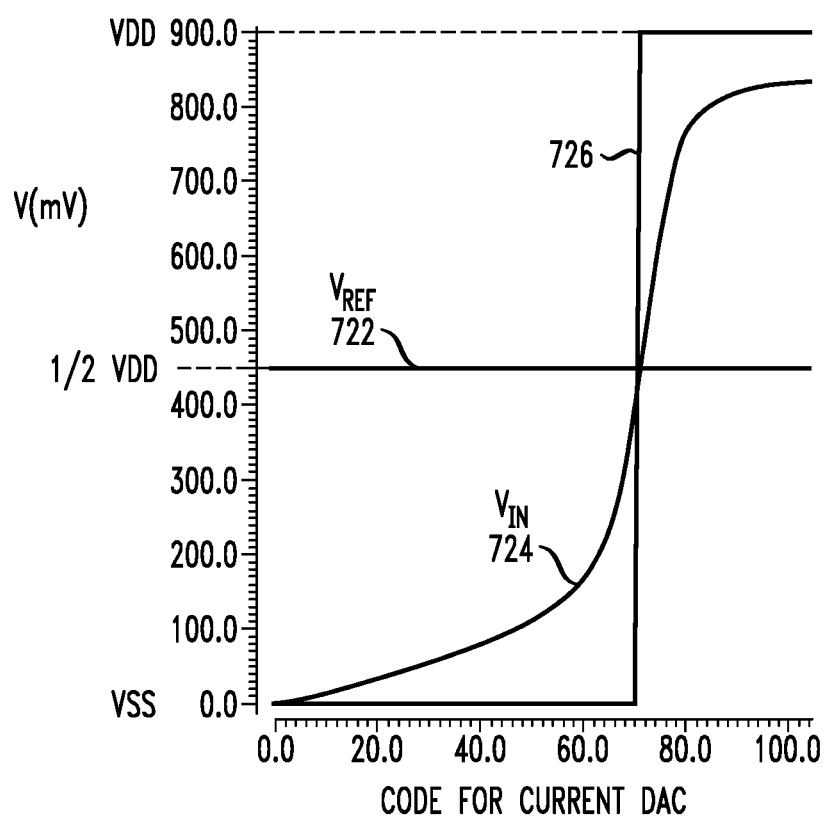

FIGS. 7A and 7B illustrate a process for calibrating baseband currents in an RF signal generator system, according to an exemplary embodiment of the disclosure. More specifically, FIG. 7A illustrates a flow diagram of an exemplary signal calibration process, and FIG. 7B is a waveform diagram which illustrates an exemplary mode of operation of a current measurement circuit. For purposes of illustration, FIGS. 7A and 7B may be explained in the context of the exemplary embodiments of the RF signal generator and calibration systems shown in FIGS. 2 and 3. Referring to FIG. 7A, a calibration process is commenced by the calibration system (block 700) to calibrate baseband signals (e.g., I/Q signals) of the RF signal generation system. Depending on the given application of the RF signal generator system, a calibration process can be automatically commenced by the calibration system upon power-up of the RF signal generator system. Further, in some embodiments, a calibration process can be performed automatically or manually anytime during an idle mode of operation of the RF signal generator system.

The calibration process comprises an initialization phase in which various settings are applied to configure a calibration mode of the RF signal generator system and the calibration system. For example, digital control signals are applied to the amplifier/attenuation stage at the output of the mixer stage to turn off all transistors in the amplifier/attenuation and thus shut off the amplifier/attenuation stage (step 701). In particular, in the exemplary embodiment of FIG. 2, as discussed above, a DC voltage of logic "1" is applied to the gate terminals of all transistors in the signal attenuation stage 230 to turn off all transistors, which results in completely turning off the signal attenuation stage 230 so that the DC baseband currents $I^+$, $I^-$, $Q^+$, and $Q^-$ to be measured are routed from the output of the current-commutating mixer stage 220 into the current measurement circuitry 250.

Furthermore, the initialization phase comprises setting a baseband gain of the baseband input stage to a desired level (block 702). As noted above, in the exemplary embodiment of FIG. 2, the baseband signal input stage 210 comprises variable-width transistors 211, 212, 213, and 214, which can be configured to adjust the baseband signal gain in the I/Q signal paths. For example, as noted above, in some embodiments, the DC baseband currents can be adjusted to one of various target current levels over a given range wherein a highest baseband current level is about 10× greater than a lowest baseband current level (e.g., a range from about 35 uA to about 350 uA), to provide 20 dB of gain variation. For the initial setting and baseband signal measurements, the transistors 211, 212, 213, and 214 of the baseband signal input stage 210 can be set to the lowest gain setting (e.g., smallest width setting for lowest baseband current).

In addition, the initialization phase comprises adjusting the current DAC segments of the current measurement circuitry 250 based on the current gain setting of the baseband signal input stage 210, and setting the initial code of the current mode DAC to the mid-value level (block 703). As noted above, in some embodiments, the current mode DAC (which is implemented in the current measurement circuitry) is configured to operate over the full range of the current levels of the DC baseband signals (that is dependent on baseband signal gain) to be measured. In this regard, depending on the gain setting of the baseband signal input stage 210, the current sources of the coarse and fine segments of the current DAC can be scaled (e.g., increased or decreased) according to the baseband gain setting to enable proper and accurate measurement of the DC baseband currents.

Next, the calibration process configures the current measurement circuitry to enable input of a target baseband current to be measured from a given output node of the mixer stage (block 704). For example, in the exemplary embodiment shown in FIG. 3, the current measurement circuitry 300 can be configured to input a baseband current on the output node INT_0 by activating the switch SW0 of the first current sink circuit 310 (while keeping the switch SW1 turned off) and deactivating the switch SW2 to thereby configure an active current mirror circuit comprising the transistor 312 (in a diode-connected transistor configuration) and the mirror transistor 330. Alternatively, the current measurement circuitry 300 can be configured to input a baseband current on the output node INT_1 by activating the switch SW1 of the second current sink circuit 320 (while keeping the switch SW0 turned off) and deactivating the switch SW2 to thereby configure an active current mirror circuit comprising the transistor 322 (in a diode-connected transistor configuration) and the mirror transistor 330.

In addition, the LO signal inputs, which are applied to the mixers in the mixer stage, are configured with the proper DC voltages so that the mixer stage outputs the target DC baseband current to be measured on the target output node (block 705). For example, as noted above, in some embodiments, the mixing transistors of the differential I and Q mixers 220-1 and 220-2 in the current-commutating mixer stage 220 (FIG. 2) are selectively activated/deactivated by applying DC LO voltages (logic High or logic Low) to the gate terminals of the mixing transistors, as needed, in order to output the target DC baseband current to be measured on one of the output nodes INT_0 or INT_1 of the current-commutating mixer stage 220. For example, as illustrated in the table 600 of FIG. 6, the DC baseband current $I^+$ can be generated and output to the node INT_1 by applying a DC LO voltage of logic "0" (Low) to the LO_I inputs of the differential I mixer 220-1, and applying a DC LO voltage of logic "1" to the $\overline{LO\_I}$, LO_Q and $\overline{LO\_Q}$ inputs of the differential I and Q mixers 220-1 and 220-2. With the INT_1 input of the second current sink circuit 320 enabled, the DC baseband current $I^+$ will be measured by the current measurement circuitry 300.

When the DC baseband current flows into the current measurement circuitry 300, the comparator 350 will compare the voltage ($V_{IN}$) generated on the high impedance node N2 with the reference voltage $V_{REF}$ (e.g., ½VDD), and the control process will determine the initial logic level that is generated at the output of the comparator 350 (block 706). If the comparator output is determined (in block 706) to be at an initial logic "0" level, this is an indication that the DC baseband current is greater than the DAC reference current $I_{REF}$ being output from the current DAC circuit 340 (at the mid-point code setting). In response, the control process will adjust (e.g., increment) the code setting of the current DAC circuit 340 to increase the level of reference current $I_{REF}$ that is generated and output from the current DAC circuit 340 (block 707). In some embodiments, the DAC code is adjusted using a suitable binary search process to select a next code setting of the current DAC circuit 340. After incrementing the code setting of the current DAC circuit 340, the control process will determine whether or not the comparator output is still at the initial logic "0" level (block 708).

The code setting of the current DAC circuit 340 is incrementally adjusted while the comparator output remains at the initial logic "0" level (repeat blocks 707 and 708) until the output of the comparator 350 switches from the initial logic "0" level to a logic "1" level. When the control process determines that the output of the comparator 350 is no longer at the initial logic "0" level (negative determination in block 708), the control process will determine that the reference current $I_{REF}$ output from the current DAC circuit 340 is equal to, or at least substantially equal to, the DC baseband current being measured and the control process will record (e.g., store) the current DAC code setting (block 709), wherein the recorded code setting represents the measurement for the DC baseband current.

On the other hand, if the comparator output is determined (in block 706) to be at an initial logic "1" level, this is an indication that the DC baseband current is less than the DAC reference current $I_{REF}$ being output from the current DAC circuit 340 (at the mid-point code setting). In response, the control process will adjust (e.g., decrement) the code setting of the current DAC circuit 340 to decrease the level of reference current $I_{REF}$ that is generated and output from the current DAC circuit 340 (block 710). In some embodiments, the DAC code is adjusted using a suitable binary search process to select a next code setting of the current DAC circuit 340. After decrementing the code setting of the current DAC circuit 340, the control process will determine whether or not the comparator output is still at the initial logic "1" level (block 711).

The code setting of the current DAC circuit 340 is decrementally adjusted while the comparator output remains at the initial logic "1" level (repeat blocks 710 and 711) until the output of the comparator 350 switches from the initial logic "1" level to a logic "0" level. In particular, when the control process determines that the output of the comparator 350 is no longer at the initial logic "1" level (negative determination in block 711), the control process will determine that the reference current $I_{REF}$ output from the current DAC circuit 340 is equal to, or at least substantially equal to, the DC baseband current being measured and the control process will record (e.g., store) the current DAC code setting (block 709), wherein the recorded code setting represents the measurement for the DC baseband current.

Once the code setting has been recorded for the measured DC baseband current, the control process will determine if the baseband current measurements are complete for all individual I-phase and Q-phase baseband components $I^+$, $I^-$, $Q^+$, and $Q^-$ for the given baseband gain setting (block 712). If there are one or more additional DC baseband currents to be measured (negative determination in block 712), the calibration process flow returns to block 703, wherein the current DAC circuit 340, the current sink circuits 310 and 320, and the DC LO inputs to the mixer stage are initialized and configured, as needed, to measure the next selected DC baseband current using the same measurement process (blocks 706-711) as discussed above.

When the DC baseband current measurements have been completed for all individual I-phase and Q-phase baseband components $I^+$, $I^-$, $Q^+$, and $Q^-$ for the given baseband gain setting (affirmative determination in block 712), the control process will determine if the DC baseband current measurements (for all individual I-phase and Q-phase baseband components $I^+$, $I^-$, $Q^+$, and $Q^-$) are complete for all baseband gain step settings (block 713). If there are one or more additional baseband gain step settings for the DC baseband currents that need to be measured (negative determination in block 713), the calibration process flow returns to block 702, wherein the baseband gain setting is set to the next gain step setting, and the current DAC circuit 340, the current sink circuits 310 and 320, and the DC LO inputs to the mixer stage, are initialized and configured, as needed, to measure the first selected DC baseband current for the new baseband gain setting, using the same measurement process (blocks 706-711) as discussed above.

When the DC baseband current measurements (for all individual I-phase and Q-phase baseband components $I^+$, $I^-$, $Q^+$, and $Q^-$) are complete for all baseband gain step settings (affirmative determination in block 713), the calibration database will have recently recorded current DAC code settings for each measured DC baseband current $I^+$, $I^-$, $Q^+$, and $Q^-$ for each baseband gain step setting. The control process will then proceed to adjust the code settings of the first and second DC offset compensation DACs 270 and 272 (FIG. 2), as needed, to minimize offset (imbalance) between (i) the DC baseband currents $I^+$ and $I^-$, (ii) the DC baseband currents $Q^+$ and Q, and (iii) the DC baseband currents for $I^+$ and $Q^+$, for a selected baseband gain setting (block 714), at which time the calibration process terminates (block 715). If the baseband gain setting is subsequently adjusted (increased or decreased), the calibration system can access the calibration database to determine the recently recorded current DAC codes for the measured DC baseband currents $I^+$, $I^-$, $Q^+$, and $Q^-$ for the newly adjusted baseband gain setting.

After the measurements, four digital codes representing the individual DC baseband currents for the four I-phase and Q-phase baseband components (I+, I−, Q+, Q−) are obtained, and the differences between the codes represent the imbalances contributing to spurs (e.g., an offset between I+ and I− represents DC offset leading to LO leakage, and offset between I+ and Q+ represents the amplitude imbalance that degrades image rejection). In this manner, both the image rejection and the LO leakage can be improved through calibration to provide an RF signal generator system with superior spur performance.

FIG. 7B is a diagram 720 which illustrates an exemplary mode of operation of a current measurement circuit when performing a compare process to measure a DC baseband current. For purposes of illustration, FIG. 7B will be described in the context of an exemplary comparison process that is performed by the current measurement circuitry 300 of FIG. 3. In FIG. 7B, a Y-axis shows voltage in millivolts (mV) in a range from 0V (e.g., VSS) to 900 mV (e.g., VDD), and an X-axis shows digital codes (e.g., ranging from 0 to 100) of a current DAC for generating reference currents.

Further, FIG. 7B illustrates exemplary voltage waveforms 722, 724, and 726. The exemplary voltage waveform 722 represents a DC reference voltage $V_{REF}$ that is applied to the inverting (−) input terminal of the comparator 350. For example, the reference voltage $V_{REF}$ is shown to be 450 mV (½ VDD). The exemplary voltage waveform 724 represents an input voltage $V_{IN}$ that is generated on the high impedance node N2 and applied to the non-inverting (+) input terminal of the comparator 350. Further, the exemplary voltage waveform 726 represents a comparator output voltage that is generated by the comparator 350 by comparing the input voltage $V_{IN}$ waveform 724 with the DC reference voltage $V_{REF}$.

The comparison process of FIG. 7B illustrates that, for a given DC baseband current being measured, as the digital code for the reference current $I_{REF}$ generated by the current DAC circuit 340 increases, a difference between the DC baseband current being measured and the reference current $I_{REF}$ output from the current DAC circuit 340 decreases, and the input voltage $V_{IN}$ waveform 724 increases. When the input voltage $V_{IN}$ waveform 724 increases to a level which crosses the DC reference voltage $V_{REF}$ 722, the comparator output voltage waveform 726 transitions (toggles) from 0 V (VSS) to 900 mV (VDD), and the measurement finishes. The digital code of the reference current $I_{REF}$ generated by the current DAC circuit 340 for which the comparator output voltage waveform 726 toggles from logic "0" to logic "1" represents the estimated measure of the given DC baseband current. In the exemplary embodiment of FIG. 7B, a digital code value of 70 of the current DAC circuit 340 corresponds to an estimated measure of the DC baseband current.

It is to be noted that calibration techniques described above comprise static current measurement techniques that are configured to compensate for, e.g., mismatches between (i) the baseband input transistors 211 and 212 for the I phase (compensate for imbalances between the I⁺ and I⁻ baseband DC currents), (ii) the baseband input transistors 213 and 214 for the Q phase (compensate for imbalances between the Q⁺ and Q⁻ baseband DC currents), and (iii) between the differential input transistor pairs 210-1 and 210-2 (compensate for imbalances between I⁺ and Q⁺ baseband DC currents), wherein such calibration is performed with zero differential voltage applied to the in-phase inputs (I(t) and $\overline{I(t)}$) and to the quadrature-phase inputs (Q(t) and $\overline{Q(t)}$). In this regard, the calibration is performed to provide current compensation to ensure that, e.g., the difference between the DC baseband currents I⁺ and I⁻ is zero (or substantially zero).

In real-time operation of the RF signal generator system, however, there can exist a duty cycle induced DC offset which results from the quadrature-phase LO signals not having a 50% duty cycle. More specifically, when the LO_I signal and/or the LO_Q signal have a duty cycle that is less than 50% or greater than 50%, the LO signal can introduce an unwanted LO tone in the RF output signal of the RF signal generator system due to a non-zero differential average LO current that is essentially injected into the I/Q signal paths, which can result in LO leakage and/or degraded image rejection.

In this regard, exemplary embodiments of the disclosure further comprise calibration circuits and methods to calibrate for duty cycle induced DC offsets resulting from quadrature-phase LO signals not having a 50% duty cycle. In particular, in some embodiments, a calibration system is configured to perform dynamic current measurements by applying a switching LO signal to one of the LO inputs of the differential I and Q mixers 220-1 and 220-2 of the current-commutating mixer stage 220 of FIG. 2 to generate an upconverted RF current signal by one mixer transistor that is being driven by the switching LO signal, while applying static DC voltages of logic "1" to the other LO inputs of the differential I and Q mixers 220-1 and 220-2 of the current-commutating mixer stage 220 to turn off the other mixing transistors. For dynamic measurements, as explained in further detail below in conjunction with FIGS. 8 and 9, the current measurement circuitry is configured to receive as input the upconverted RF current signal that is output from the current-commutating mixer stage 220, and extract and measure a DC component of the upconverted RF current signal.

Figure 8:
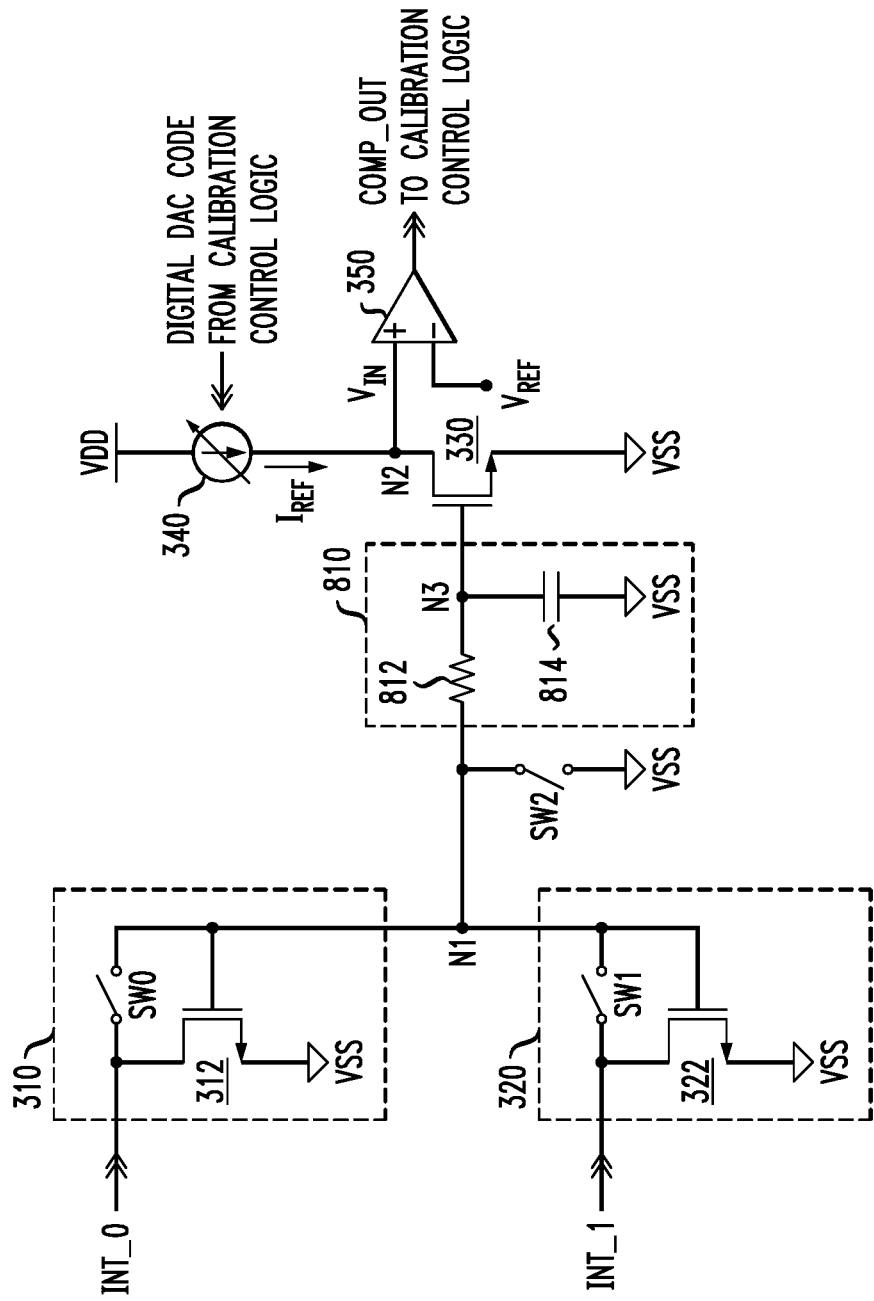
FIG. 8 schematically illustrates current measurement circuitry which is implemented by a calibration system to measure a DC component of an upconverted radio frequency current signal, according to an exemplary embodiment of the disclosure.

For example, FIG. 8 schematically illustrates current measurement circuitry 800 which is implemented by a calibration system to measure a DC component of an upconverted RF current signal, according to an exemplary embodiment of the disclosure. The current measurement circuitry 800 is similar to the current measurement circuitry 300 of FIG. 3, except that the current measurement circuitry 800 comprises a filter circuit 810 which is configured to remove high-frequency components of an upconverted RF current signal, which is output from the mixer stage as a result of applying an AC switching LO input signal (which is being tested for duty cycle error) to the mixer stage in calibration mode, and input to the current measurement circuitry 800 to measure a DC offset of the upconverted RF current signal. The presence of a non-zero DC offset current that is induced by the switching LO signal is an indication of a duty cycle error of the switching LO signal.

In some embodiments, as shown in FIG. 8, the filter circuit 810 comprises a low-pass RC filter circuit comprising a resistor 812 coupled between nodes N1 and N3, and a capacitor 814 coupled to and between the node N3 and the negative power supply node VSS. The gate terminal of the mirror transistor 330 is coupled to the node N3 (which is the output node of the filter circuit 810). In some embodiments, the current measurement circuitry 250 in FIG. 2 is implemented using the current measurement circuitry 800 of FIG. 8. In such embodiments, the current measurement circuitry 800 operates in a manner that is the same or similar to the current measurement circuitry 300 as discussed above, except that the current measurement circuitry 800 can be utilized to measure DC baseband currents or a DC offset of an upconverted RF current signal, depending on the given calibration mode of operation.

It is to be noted that dynamic baseband current measurement using switching LO signals can be performed using the same or similar techniques as discussed above for performing static baseband current measurements. For example, in some embodiments, the parameters shown in the table 600 of FIG. 6 can be utilized to perform dynamic current measurements by controlling the LO signal output configuration circuit 500 (FIG. 5) and configuring the current measurement circuitry 800 for calibration mode, except that a switching LO signal (not a static LO voltage) is applied to a given input of a mixing transistor to generate an upconverted RF current signal on one of the output nodes INT_0 or INT_1 for input to the current measurement circuitry 800.

For example, in calibration mode, an upconverted RF current signal (RF_I⁺) can be generated on the second output node INT_1 by applying a switching LO_I signal to the differential I mixer 220-1 (with each of $\overline{LO\_I}$, LO_Q and $\overline{LO\_Q}$ set to a DC voltage of logic "1"), and the upconverted RF current signal is input to the current measurement circuitry 800 by activating the switch SW1 (with the switch SW0 deactivated). Alternatively, an upconverted RF current signal (RF_I⁺) can be generated on the first output node INT_0 by applying a switching $\overline{LO\_I}$ signal to the differential I mixer 220-1 (with each of LO_I, LO_Q and $\overline{LO\_Q}$ set to a DC voltage of logic "1"), and the upconverted RF current signal is input to the current measurement circuitry 800 by activating the switch SW0 (with the switch SW1 deactivated).

In this example, the DC voltage output from the filter circuit 810 on the node N3 corresponds to the time-averaged current (DC offset current) of the upconverted RF current signal (RF_I$^+$), which provides information regarding the duty cycle of the switching LO_I signal. The current measurement circuitry 800 determines the DC offset of the upconverted RF current signal (RF_I$^+$) using the same current measurement techniques as discussed above (e.g., FIGS. 7A and 7B). The final digital DAC code of the current DAC circuit 340, which corresponds to the DC offset of the upconverted RF current signal (RF_I$^+$), is recorded in the calibration database. In this instance, the measured DC offset current will comprise (i) a DC baseband current (bias current) that is generated from the baseband signal input stage 210 and (ii) a DC offset current (if any) that is generated as a result of a duty cycle error (if any) of the switching LO signal.

Similar dynamic baseband current measurements can be individually performed to determine DC offsets of other upconverted RF current signals (e.g., RF_I$^-$, RF_Q$^+$, and RF_Q$^-$) as a result of associated switching LO_I and LO_Q signals applied to the current-commutating mixer stage 220. The digital codes of the current DAC circuit 340, which represent the measured DC offset currents of the respective upconverted RF current signals (e.g., RF_I$^-$, RF_Q$^+$, and RF_Q$^-$) are recorded in the calibration database. These digital codes can be utilized to obtain information regarding the DC offset currents that are generated as a result of LO duty cycle errors. For example, the difference between (i) the digital DAC code representing the measured DC baseband current I$^+$ and (ii) the digital DAC code representing the measured DC offset current for the upconverted RF current signal RF_I$^+$, can provide relative information regarding the amount of LO_I duty cycle error. It is to be noted that in some embodiments, duty cycle induced imbalances can be corrected by adjusting the fundamental baseband signal components I$^+$ and Q$^+$ using the first and second DAC circuits 121 and 122 (FIG. 1).

Figure 9:
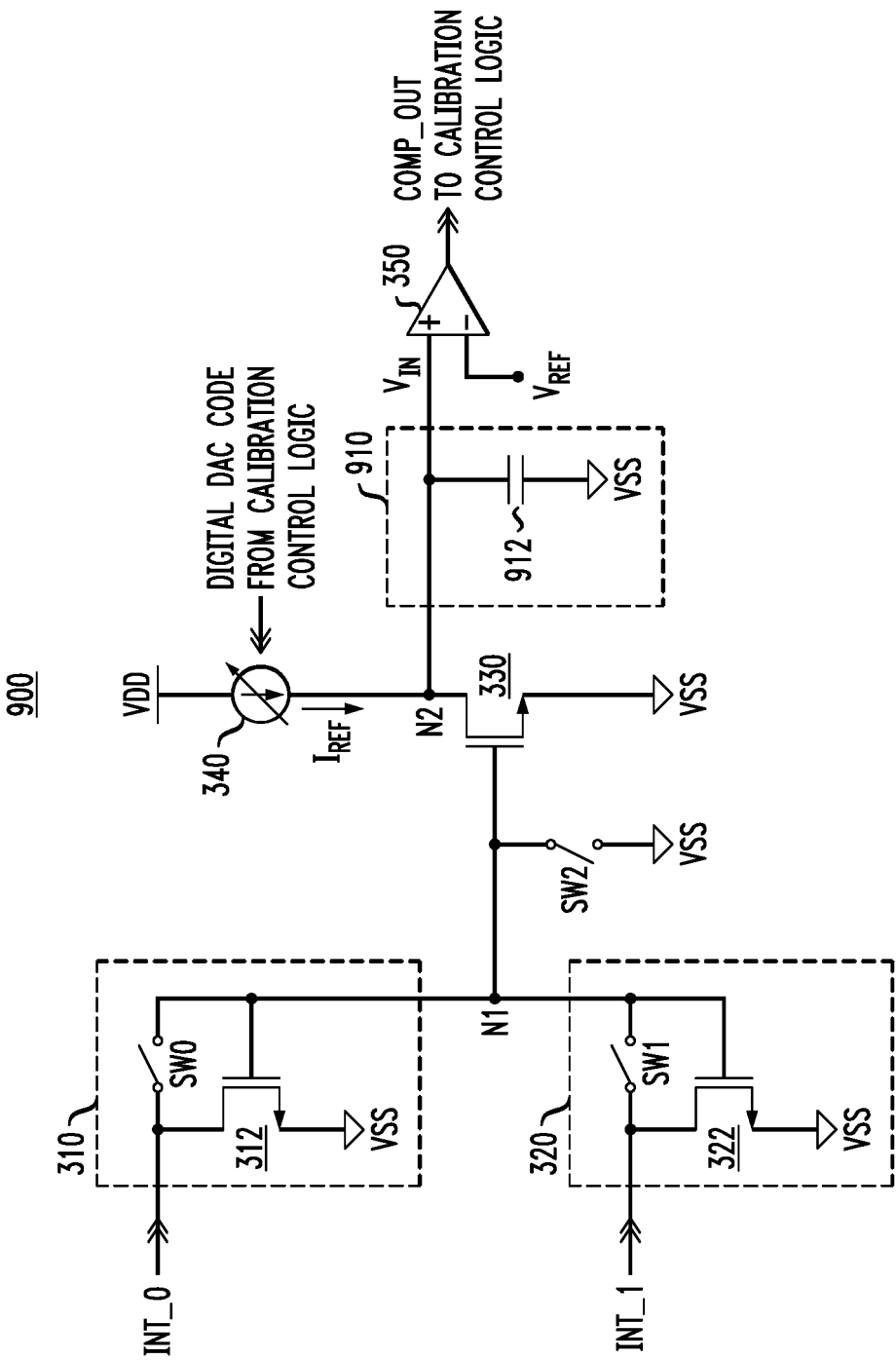
FIG. 9 schematically illustrates current measurement circuitry which is implemented by a calibration system to measure a DC component of an upconverted radio frequency current signal, according to another exemplary embodiment of the disclosure.

Next, FIG. 9 schematically illustrates current measurement circuitry which is implemented by a calibration system to measure a DC component of an upconverted RF current signal, according to another exemplary embodiment of the disclosure. The current measurement circuitry 900 is similar to the current measurement circuitry 800 of FIG. 8, except that the current measurement circuitry 900 comprises a filter circuit 910 coupled to the high-impedance node N2 to remove high-frequency components. In some embodiments, the filter circuit 910 comprises a low pass filter which comprises a capacitor 912 coupled to and between the node N2 and the negative power supply node VSS. The current measurement circuitry 900 operates in a manner similar to the current measurement circuitry 300 and 800 as discussed above. The implementation of the filter circuit 910 at the high impedance node N2 serves to reduce swing and enhance measurement accuracy.

It is to be appreciated that the exemplary calibration systems, circuitry, and methods as discussed herein provide significant advantages over conventional techniques that are commonly utilized to calibrate RF signal generators, etc. For example, as noted above, conventional techniques include RF measurement techniques which utilize on-chip or off-chip instrumentation that is configured to analyze the RF signals that are generated by the RF signal generator using, e.g., a complex spectrum analyzer, or a down-conversion receiver (in feedback loops) to extract the baseband signal components from the RF signal, and calibrate the DACs to compensate for imbalances that are detected in the extracted baseband signal components. The conventional RF measurement techniques are costly in terms of complexity, resource usage, and area overhead needed for on-chip implementation. In addition, such conventional RF techniques consume a significant amount of power, which is prohibitive at cryogenic temperatures.

In contrast to conventional calibration techniques which perform RF measurements, the exemplary calibration techniques as disclosed herein utilize DC baseband current measurements which are much easier to perform and are less time consuming than RF measurements. In addition, the exemplary DC baseband current measurement techniques as discussed herein are significantly less costly in terms of hardware complexity and resources as compared to using on-chip spectrum analyzers or loopback receivers to detect signal imbalances. In addition, the DC current measurement hardware and other calibration-related hardware can operate at very low power (e.g., order of milliwatts), and such hardware has a relatively low footprint (occupies small chip area), which is advantageous for on-chip implementation.

Another advantage to be noted is that the same current measurement hardware (e.g., the current measurement circuitry such as shown in FIGS. 3, 8, and 9) is utilized to measure all I-phase and Q-phase baseband components I$^+$, I$^-$, Q$^+$, Q$^-$. In this regard, the current measurements are not sensitive to the intrinsic offset of the current measurement instrumentation, whereby inaccuracies of the current measurement hardware will not adversely impact the accuracy of the measurements. For example, since the same current measurement hardware is utilized to measure the DC currents for all I-phase and Q-phase baseband components I$^+$, I$^-$, Q$^+$, Q$^-$, in the absence of drift, any intrinsic offset in the circuitry, e.g., comparator offset, will be applied to all the DC current measurements, which, effectively cancels out such intrinsic errors in the DC current measurements. In this regard, the measuring instrumentation does not need high absolute accuracy to ensure that all baseband currents are equal to one another, as any intrinsic error in the measurements will not affect the ability of the calibration process to correct imbalances in the I/Q baseband currents by equalizing the baseband currents for {I$^+$, I$^-$}, {Q$^+$, Q$^-$}, and {I$^+$, Q$^+$}.

Moreover, the same calibration hardware is utilized to calibrate both LO leakage and image rejection. In addition, since the same hardware is utilized to measure DC currents for all I-phase and Q-phase baseband components I$^+$, I$^-$, Q$^+$, Q$^-$ and correcting imbalances, the overall area needed for the calibration instrumentation is significantly reduced. For example, for on-chip instrumentation, utilizing the same calibration hardware to measure all I-phase and Q-phase baseband components I$^+$, I$^-$, Q$^+$, Q$^-$ allows for reduced area overhead needed for the on-chip instrumentation, e.g., less than 10%.

Another advantage to be noted is that the baseband signals are sensed at low impedance nodes (e.g., nodes INT_0 and INT_1, FIG. 2) at the output of a current mode stage of the RF signal generator system, which serves to minimize the loading effects of the current measurement circuitry, and thus minimize any reduction in bandwidth during normal mode operation of the RF signal generator system.

In addition, moreover, in the exemplary embodiment of FIG. 2, where the current measurement circuitry is coupled to the output nodes of the current-commutating mixer stage 220, the voltage headroom across the transistors in the baseband signal input stage 210 and the transistors in the current-commutating mixer stage 220 can be maintained largely the same, ensuring that in a calibration mode, the DC baseband currents are measured under conditions that match those under normal operating mode. In other words, the architecture shown in FIG. 2 maintains a similar voltage headroom across the baseband and mixer transistors in both the normal and the calibration modes.

Another advantage to be noted is that the current measurement circuitry utilizes a wide range, high-resolution current mode DAC having coarse and fine DAC segments for generating a reference current $I_{REF}$ with a desired resolution, over a wide range of reference currents $I_{REF}$, to perform current comparison between a baseband current being measured and the reference current with high accuracy. In addition, as noted above, to support wide range scaling, the current mode DAC implements a prescaler DAC segment that is used to scale the output range of the current mode DAC so that the output reference current $I_{REF}$ generated by the current mode DAC can be scaled to be commensurate with the amplitude levels of the baseband currents to be measured and thereby allow DC measurements to be performed at higher and lower amplitude levels (e.g., variation is performed over a 10× range such as from 35 μA to 350 μA).

Another advantage to be noted is that current imbalances that are detected by the calibration system are corrected using current imbalance correction circuitry which is configured to inject additional current into the baseband signal paths. For example, the LO leakage calibration control is provided by adjusting a digital code of the offset control DAC located at the output of the baseband stage. The same offset control DACs can be used to equalize the I and Q currents. If a gain adjustment is needed between the channels, the reference currents for the I and Q DACs can be adjusted.

Another advantage to be noted is that the exemplary calibration circuitry as described herein is configured to operate at low power (e.g., milliwatt range) and low area overhead, which allows such calibration circuitry to be readily implemented as on-chip calibration instrumentation to calibrate cryo-electronics used for quantum computing applications and other applications or systems which operate at cryogenic temperatures. For example, in the context of quantum computing systems which implement superconducting qubits and other components, the exemplary calibration circuitry as described herein can be readily implemented on-chip with an AWG system. In such embodiments, the on-chip calibration instrumentation is utilized to calibrate the AWG system to generate high-fidelity RF control pulses to control superconducting qubits and thereby achieve high-fidelity qubit gate operations (e.g., single-qubit gate operations, entanglement gate operations, etc.). In particular, the exemplary calibration techniques as discussed herein can be utilized to generate high-fidelity RF control pulses having no, or significantly suppressed, LO leakage and sideband image spurs, which would otherwise lead to lower fidelity gate operations.

Figure 10:
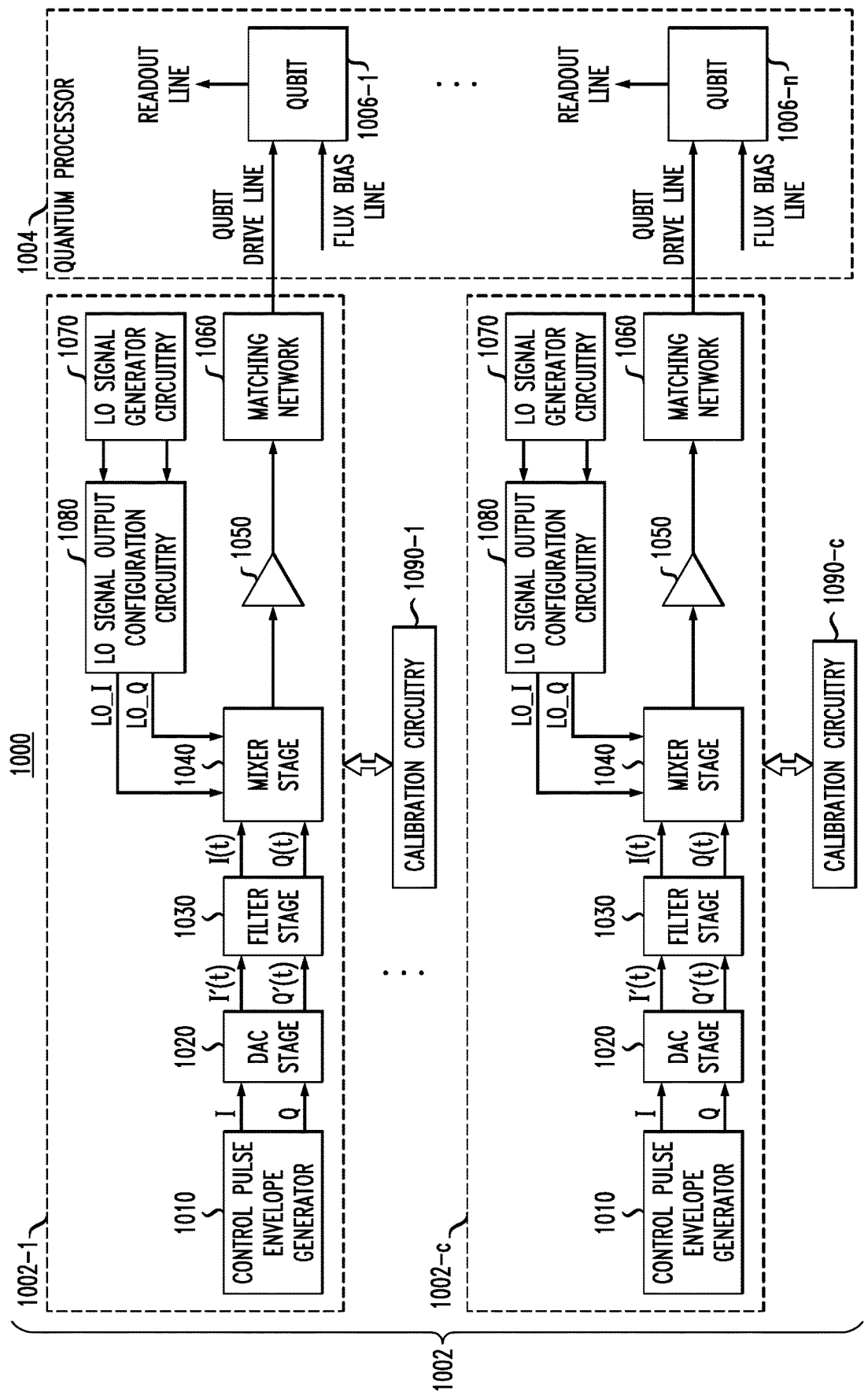
FIG. 10 schematically illustrates a quantum computing system which implements an arbitrary waveform generator system and calibration circuitry, according to an exemplary embodiment of the disclosure.

FIG. 10 schematically illustrates a quantum computing system 1000 which implements an arbitrary waveform generator system and calibration circuitry, according to an exemplary embodiment of the disclosure. The quantum computing system 1000 comprises an arbitrary waveform generator system 1002 (or AWG system 1002) and a quantum processor 1004. The quantum processor 1004 comprises a plurality (n) of superconducting qubits 1006-1, . . . , 1006-n. The superconducting qubits 1006-1, . . . , 1006-n may comprise superconducting transmon qubits, superconducting fluxonium qubits, superconducting multi-mode qubits, and other types, or combinations of different types, of superconducting qubits, which are suitable for a given application. Further, in some embodiments, the quantum processor 1004 comprises coupler circuits (e.g., passive coupler circuits and/or active coupler circuits), wherein a given coupler circuit is configured to couple a pair of superconducting qubits to implement entanglement gate operations (e.g., two-qubit gate operations).

The quantum processor 1004 further comprises a plurality of control lines (e.g., transmission line resonators) including, but not limited to, qubit drive lines, flux bias lines, state readout lines, and active coupler drive lines, etc. In some embodiments, the qubit drive lines are coupled (e.g., capacitively coupled) to respective ones of the superconducting qubits 1006-1, . . . 1006-n. The qubit drive lines are configured to apply RF control pulses (which are generated by the AWG system 1002) to the respective superconducting qubits 1006-1, . . . , 1006-n to independently change the states of the respective superconducting qubits (e.g., single-qubit gate operations), e.g., change the state of given superconducting qubit to be in, e.g., a ground state |0⟩, an excited state |1⟩, or a superposition state. As is known in the art, the state of a superconducting qubit can be changed by applying an RF control pulse with a center frequency that is equal to a transition frequency (denoted $f_{01}$) of the qubit, wherein the transition frequency $f_{01}$ corresponds to an energy difference between the ground state |0⟩ and excited state |1⟩ of the qubit. In some embodiments, the superconducting qubits 1006-1, . . . , 1006-n are configured to have different operating frequencies (transition frequencies) so that the transition frequencies of neighboring qubits are detuned.

The state readout lines are coupled to respective ones of the superconducting qubits 1006-1, . . . , 1006-n to read the states of the superconducting qubits using known techniques (e.g., dispersive readout). In embodiments where the superconducting qubits comprise frequency-tunable qubits (e.g., flux-tunable transmon qubits or fluxonium qubits, etc.), the flux bias control lines would be coupled (e.g., inductively coupled) to respective superconducting qubits to apply flux bias control signals to tuning structures of the superconducting qubits to tune the operating frequencies of the tunable qubits, as needed for a given application. In addition, for active coupler circuits, coupler drive lines would be coupled (e.g., capacitively coupled) to respective coupler circuits, wherein each coupler circuit would have an operating frequency or transition frequency. A given coupler circuit would be driven by an RF control pulse generated by the AWG system 1002, or some other pulse signal generator, to enable exchange coupling between superconducting qubits that are coupled through the given coupler circuit and implement a two-qubit gate operation.

As shown in FIG. 10, the AWG system 1002 comprises a multi-channel AWG framework which comprises a plurality of AWG channels 1002-1, . . . , 1002-c. The AWG channels 1002-1, . . . , 1002-c are configured to generate RF control pulses that are applied on the qubit drive lines to control respective ones of the superconducting qubits 1006-1, . . . , 1006-n. Although not specifically shown in FIG. 10, in some embodiments, the AWG system 1002 would include AWG channels to generate control signals that are applied to the coupler drive lines to control active coupler devices of the quantum processor 1004.

The AWG channels 1002-1, . . . , 1002-c each comprise a respective control pulse envelope generator 1010, a DAC stage 1020, a baseband filter stage 1030, an I/Q mixer stage 1040, an amplifier/attenuator stage 1050, a matching network 1060, an LO signal generator circuit 1070, and an LO signal output configuration circuit 1080. The control pulse envelope generators 1010 are configured to implement pulse-shaping techniques to generate RF control pulses with desired control pulse envelope shapes (e.g., Gaussian pulses, cosine pulses (e.g., sum of half cosines), hyperbolic secant pulses, etc.), which are applied to superconducting qubits or active qubit coupler circuits to perform single qubit gate operations, entanglement gate operations, etc. The shaped control pulses are calibrated to drive $f_{01}$ transitions of the qubits, while suppressing $f_{12}$ and higher transitions. Essentially, such pulse shaping techniques suppress/reduce the transients associated with turning the control pulses on and off. In addition, pulse-shaping techniques include DRAG (derivative removal by adiabatic gate) correction pulses, which can be used in conjunction with shaped pulses (such as Gaussian pulses, cosine pulses, or hyperbolic secant pulses) to further suppress unwanted state transitions, while maintaining a same pulse envelope area (or integral of pulse envelope).

In each AWG channel of the AWG system 1002, the digital control pulse envelope signals (digital I and Q components) are converted to analog control pulse envelope signals (analog baseband I/Q signals), and the I/Q mixer stage 1040 modulates the quadrature LO signals using the baseband I/Q signals by performing, e.g., SSB modulation, as discussed above, to generate a modulated signal in the form of an RF control pulse that is applied, e.g., on a qubit drive line to control a given qubit. The functions of the various stages 1020, 1030, 1050, 1060, 1070, and 1080 are the same or similar to the corresponding stages in FIG. 1, FIG. 2, etc., the details of which will not be repeated.

As further shown in FIG. 10, in some embodiments, each AWG channel 1002-1, . . . , 1002-c of the AWG system 1002 comprises dedicated calibration circuitry 1090-1, . . . , 1090-c, which is implemented on-chip with the AWG system 1002. The calibration circuitry 1090-1, . . . , 1090-c is configured to calibrate the I/Q signal currents for the respective AWG channel 1002-1, . . . , 1002-c of the AWG system 1002, when the AWG channels 1002-1, . . . , 1002-c are configured in calibration mode, as discussed above. The calibration circuitry 1090-1, . . . , 1090-c comprises the hardware control and logic circuitry (e.g., current measurement circuits, current mode DACs, control logic circuitry, current imbalance correction circuitry, etc.) as discussed above. In some embodiments, the calibration circuitry 1090-1, . . . , 1090-c is controlled by software running on a computing platform that controls the quantum computing system 1000.

Figure 11:
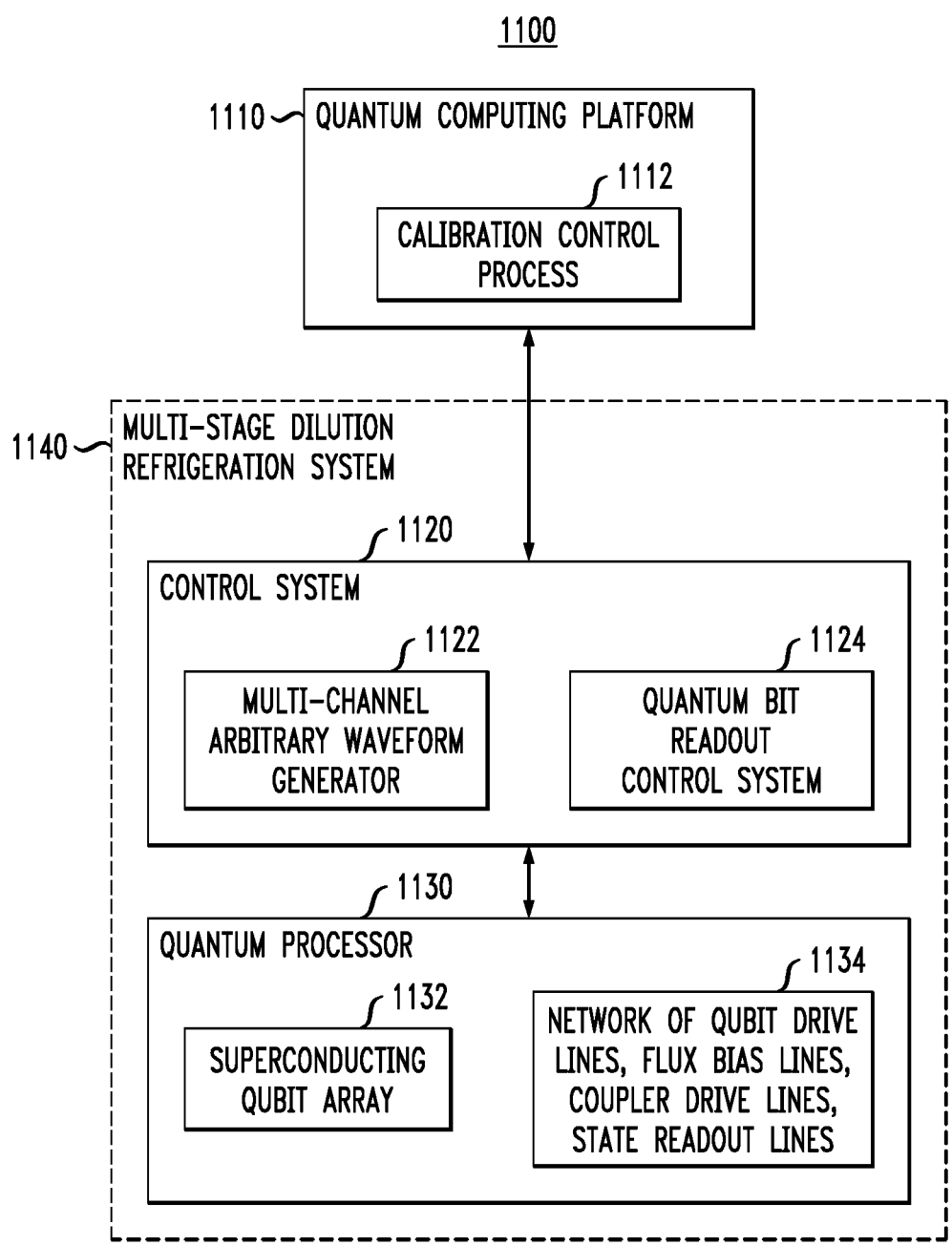
FIG. 11 schematically illustrates a quantum computing system, according to another exemplary embodiment of the disclosure.

For example, FIG. 11 schematically illustrates a quantum computing system, according to another exemplary embodiment of the disclosure. In particular, FIG. 11 schematically illustrates a quantum computing system 1100 which comprises a quantum computing platform 1110, a control system 1120, and a quantum processor 1130. In some embodiments, the quantum computing platform 1110 implements software control programs such as a calibration control process 1112 which performs functions such as configuring the AWG system and calibration circuit to be in calibration mode, controlling the execution of high-level functions of the calibration processes, etc.

Furthermore, the quantum computing platform 1110 executes calibration procedures that are periodically performed on a quantum system such as a quantum processor to calibrate various quantum elements such as readout resonators, data qubits, and coupler circuitry, etc., to enable high-fidelity gate operations (e.g., single-qubit gate operations and entanglement gate operations). For example, various types of in-situ calibration procedures are periodically performed to, e.g., determine the resonant frequencies of readout resonators, determine the transition frequencies of qubits, determine coherence times ($T_1$) of the qubits (where the coherence time $T_1$ of a given qubit denotes the time it takes for the qubit state to decay from the excited state to the ground state), determine transverse relaxation times ($T_2$) of the qubits (or dephasing time), calibrate RF control pulses that are applied to qubits to perform single-qubit gate operations, calibrate RF control pulses that are applied to active coupler circuits to perform entanglement gate operations, etc. The calibration procedures result in determining various control parameters that are maintained in a calibration database and periodically updated on the order of seconds, minutes, hours, days, etc., as needed, depending on the type of quantum element and the operating characteristics of the quantum computing system, and other factors as is understood by those of ordinary skill in the art.

In some embodiments, the control system 1120 comprises a multi-channel arbitrary waveform generator 1122, and a quantum bit readout control system 1124 (wherein FIG. 10 schematically illustrates an exemplary AWG system 1002 which can be implanted in the control system 1120). The quantum processor 1130 comprises a solid-state semiconductor chip having a superconducting qubit array 1132 and a network 1134 of qubit drive lines, coupler drive lines, and qubit state readout lines, and other circuit QED components that may be needed for a given application or quantum system configuration.

In some embodiments, the control system 1120 and the quantum processor 1130 are disposed in a dilution refrigeration system 1140 which can generate cryogenic temperatures that are sufficient to operate components of the control system 1120 for quantum computing applications. For example, the quantum processor 1130 may need to be cooled down to near-absolute zero, e.g., 10-15 millikelvin (mK), to allow the superconducting qubits to exhibit quantum behaviors. In some embodiments, the dilution refrigeration system 1140 comprises a multi-stage dilution refrigerator where the components of the control system 1120 can be maintained at different cryogenic temperatures, as needed. For example, while the quantum processor 1130 may need to be cooled down to, e.g., 10-15 mK, the circuit components of the control system 1120 may be operated at cryogenic temperatures greater than 10-15 mK (e.g., cryogenic temperatures in a range of 3K-4K), depending on the configuration of the quantum computing system.

In some embodiments, the superconducting qubit array 1132 comprises a plurality of superconducting transmon qubits and superconducting tunable coupler qubits, in which each pair of superconducting qubits is connected by a respective superconducting qubit coupler, using techniques as discussed herein. The network 1134 of qubit drive lines, flux bias lines, coupler drive lines, and qubit state readout lines, etc., are configured to apply microwave control signals to superconducting qubits and coupler circuitry in the superconducting qubit array 1132 to perform various types of gate operations, e.g., single-gate operations, entanglement gate operations, etc., as well as read the quantum states of the superconducting qubits. The network 1134 of qubit drive lines, flux bias lines, coupler drive lines, and qubit state readout lines, etc., is coupled to the control system 1120 through a suitable hardware input/output (I/O) interface, which couples I/O signals between the control system 1120 and the quantum processor 1130. For example, the hardware I/O interface may comprise various types of hardware and components, such as RF cables, wiring, RF elements, optical fibers, heat exchanges, filters, amplifiers, isolators, etc.

Figure 12:
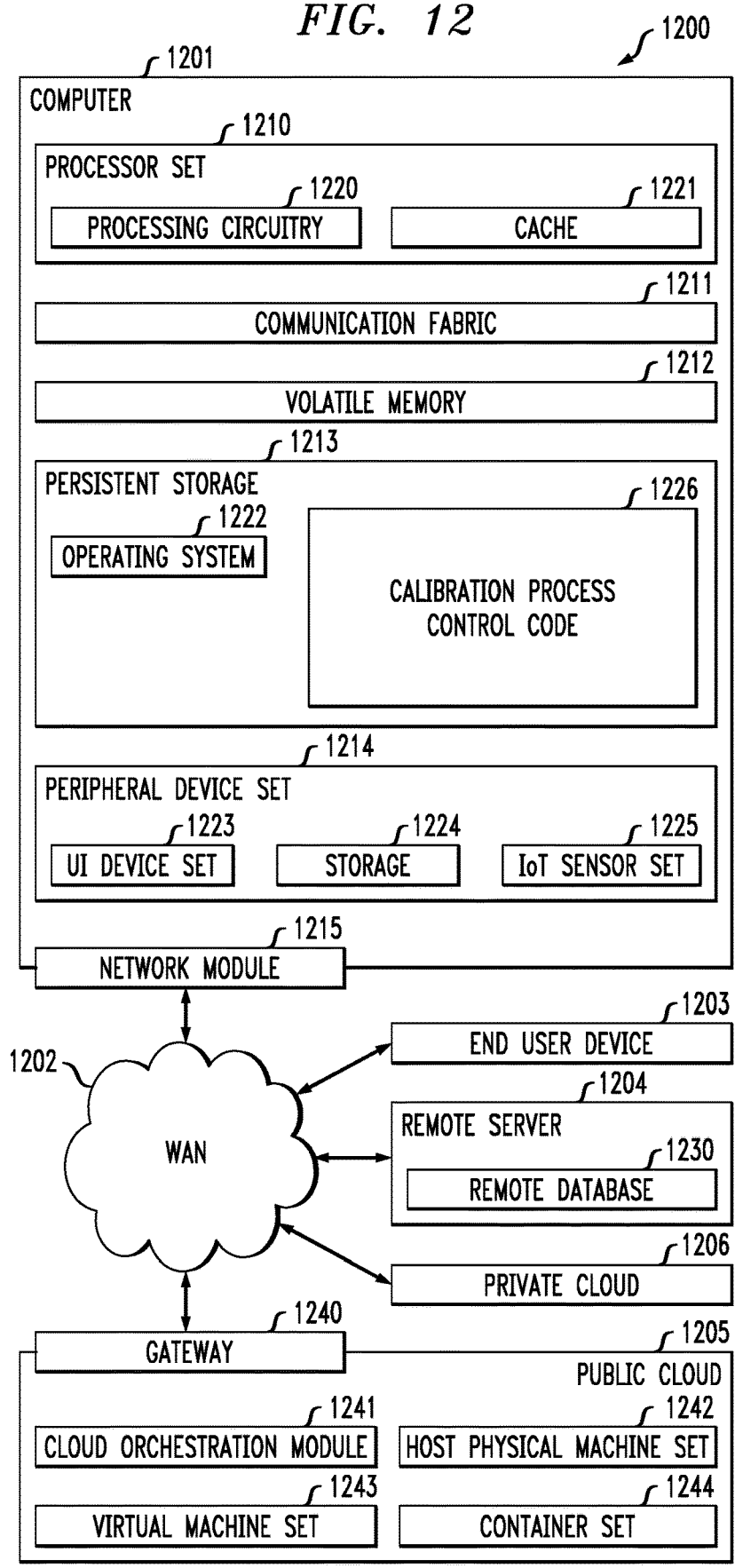
FIG. 12 schematically illustrates an exemplary computing environment which is configured to execute program instructions for controlling calibration processes of a calibration system, according to an exemplary embodiment of the disclosure.

The quantum computing platform 1110 comprises a software and hardware platform which comprises various software layers that are configured to perform various functions, including, but not limited to, generating and implementing various quantum applications using suitable quantum programming languages, configuring and implementing various quantum gate operations, compiling quantum programs into a quantum assembly language, implementing and utilizing a suitable quantum instruction set architecture (ISA), performing calibration operations to calibrate the quantum circuit elements and gate operations, etc. In addition, the quantum computing platform 1110 comprises a hardware architecture of processors, memory, etc., which is configured to control the execution of quantum applications, and interface with the control system 1120 to (i) generate digital control signals that are converted to analog microwave control signals by the control system 1120, to control operations of the quantum processor 1130 when executing a given quantum application, and (ii) to obtain and process digital signals received from the control system 1120, which represent the processing results generated by the quantum processor 1130 when executing various gate operations for a given quantum application. In some exemplary embodiments, the quantum computing platform 1110 of the quantum computing system 1100 may be implemented using any suitable computing system architecture (e.g., as shown in FIG. 12) which is configured to implement methods to support quantum computing operations by executing computer readable program instructions that are embodied on a computer program product which includes a computer readable storage medium (or media) having such computer readable program instructions thereon for causing a processor to perform control methods as discussed herein.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random-access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 1200 contains an example of an environment for the execution of at least some of the computer code involved in performing the inventive methods, such as calibration process control code 1226 for controlling a calibration process, such as shown in FIG. 7A. In addition to block 1226, computing environment 1200 includes, for example, computer 1201, wide area network (WAN) 1202, end user device (EUD) 1203, remote server 1204, public cloud 1205, and private cloud 1206. In this embodiment, computer 1201 includes processor set 1210 (including processing circuitry 1220 and cache 1221), communication fabric 1211, volatile memory 1212, persistent storage 1213 (including operating system 1222 and block 1226, as identified above), peripheral device set 1214 (including user interface (UI), device set 1223, storage 1224, and Internet of Things (IoT) sensor set 1225), and network module 1215. Remote server 1204 includes remote database 1230. Public cloud 1205 includes gateway 1240, cloud orchestration module 1241, host physical machine set 1242, virtual machine set 1243, and container set 1244.

Computer 1201 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 1230. As is well understood in the art of computer technology, and depending upon the technology, performance of a computer-implemented method may be distributed among multiple computers and/or between multiple locations. On the other hand, in this presentation of computing environment 1200, detailed discussion is focused on a single computer, specifically computer 1201, to keep the presentation as simple as possible. Computer 1201 may be located in a cloud, even though it is not shown in a cloud in FIG. 12. On the other hand, computer 1201 is not required to be in a cloud except to any extent as may be affirmatively indicated.

Processor set 1210 includes one, or more, computer processors of any type now known or to be developed in the future. Processing circuitry 1220 may be distributed over multiple packages, for example, multiple, coordinated integrated circuit chips. Processing circuitry 1220 may implement multiple processor threads and/or multiple processor cores. Cache 1221 is memory that is located in the processor chip package(s) and is typically used for data or code that should be available for rapid access by the threads or cores running on processor set 1210. Cache memories are typically organized into multiple levels depending upon relative proximity to the processing circuitry. Alternatively, some, or all, of the cache for the processor set may be located "off chip." In some computing environments, processor set 1210 may be designed for working with qubits and performing quantum computing.

Computer readable program instructions are typically loaded onto computer 1201 to cause a series of operational steps to be performed by processor set 1210 of computer 1201 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 1221 and the other storage media discussed below. The program instructions, and associated data, are accessed by processor set 1210 to control and direct performance of the inventive methods. In computing environment 1200, at least some of the instructions for performing the inventive methods may be stored in block 1226 in persistent storage 1213.

Communication fabric 1211 is the signal conduction paths that allow the various components of computer 1201 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

Volatile memory 1212 is any type of volatile memory now known or to be developed in the future. Examples include dynamic type random access memory (RAM) or static type RAM. Typically, the volatile memory is characterized by random access, but this is not required unless affirmatively indicated. In computer 1201, the volatile memory 1212 is located in a single package and is internal to computer 1201, but, alternatively or additionally, the volatile memory may be distributed over multiple packages and/or located externally with respect to computer 1201.

Persistent storage 1213 is any form of non-volatile storage for computers that is now known or to be developed in the future. The non-volatility of this storage means that the stored data is maintained regardless of whether power is being supplied to computer 1201 and/or directly to persistent storage 1213. Persistent storage 1213 may be a read only memory (ROM), but typically at least a portion of the persistent storage allows writing of data, deletion of data and re-writing of data. Some familiar forms of persistent storage include magnetic disks and solid-state storage devices. Operating system 1222 may take several forms, such as various known proprietary operating systems or open source Portable Operating System Interface type operating systems that employ a kernel. The code included in block 1226 typically includes at least some of the computer code involved in performing the inventive methods.

Peripheral device set 1214 includes the set of peripheral devices of computer 1201. Data communication connections between the peripheral devices and the other components of computer 1201 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 1223 may include components such as a display screen, speaker, microphone, wearable devices (such as goggles and smart watches), keyboard, mouse, printer, touchpad, game controllers, and haptic devices. Storage 1224 is external storage, such as an external hard drive, or insertable storage, such as an SD card. Storage 1224 may be persistent and/or volatile. In some embodiments, storage 1224 may take the form of a quantum computing storage device for storing data in the form of qubits. In embodiments where computer 1201 is required to have a large amount of storage (for example, where computer 1201 locally stores and manages a large database) then this storage may be provided by peripheral storage devices designed for storing very large amounts of data, such as a storage area network (SAN) that is shared by multiple, geographically distributed computers. IoT sensor set 1225 is made up of sensors that can be used in Internet of Things applications. For example, one sensor may be a thermometer and another sensor may be a motion detector.

Network module 1215 is the collection of computer software, hardware, and firmware that allows computer 1201 to communicate with other computers through WAN 1202. Network module 1215 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 1215 are performed on the same physical hardware device. In other embodiments (for example, embodiments that utilize software-defined networking (SDN)), the control functions and the forwarding functions of network module 1215 are performed on physically separate devices, such that the control functions manage several different network hardware devices. Computer readable program instructions for performing the inventive methods can typically be downloaded to computer 1201 from an external computer or external storage device through a network adapter card or network interface included in network module 1215.

WAN 1202 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

End user device (EUD) 1203 is any computer system that is used and controlled by an end user (for example, a customer of an enterprise that operates computer 1201), and may take any of the forms discussed above in connection with computer 1201. EUD 1203 typically receives helpful and useful data from the operations of computer 1201. For example, in a hypothetical case where computer 1201 is designed to provide a recommendation to an end user, this recommendation would typically be communicated from network module 1215 of computer 1201 through WAN 1202 to EUD 1203. In this way, EUD 1203 can display, or otherwise present, the recommendation to an end user. In some embodiments, EUD 1203 may be a client device, such as thin client, heavy client, mainframe computer, desktop computer and so on.

Remote server 1204 is any computer system that serves at least some data and/or functionality to computer 1201. Remote server 1204 may be controlled and used by the same entity that operates computer 1201. Remote server 1204 represents the machine(s) that collect and store helpful and useful data for use by other computers, such as computer 1201. For example, in a hypothetical case where computer 1201 is designed and programmed to provide a recommendation based on historical data, then this historical data may be provided to computer 1201 from remote database 1230 of remote server 1204.

Public cloud 1205 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 1205 is performed by the computer hardware and/or software of cloud orchestration module 1241. The computing resources provided by public cloud 1205 are typically implemented by virtual computing environments that run on various computers making up the computers of host physical machine set 1242, which is the universe of physical computers in and/or available to public cloud 1205. The virtual computing environments (VCEs) typically take the form of virtual machines from virtual machine set 1243 and/or containers from container set 1244. It is understood that these VCEs may be stored as images and may be transferred among and between the various physical machine hosts, either as images or after instantiation of the VCE. Cloud orchestration module 1241 manages the transfer and storage of images, deploys new instantiations of VCEs and manages active instantiations of VCE deployments. Gateway 1240 is the collection of computer software, hardware, and firmware that allows public cloud 1205 to communicate through WAN 1202.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Private cloud 1206 is similar to public cloud 1205, except that the computing resources are only available for use by a single enterprise. While private cloud 1206 is depicted as being in communication with WAN 1202, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 1205 and private cloud 1206 are both part of a larger hybrid cloud.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
    a current measurement circuit which is configured, during a calibration process, to measure a first current in a first signal path of a radio frequency signal generator, and to measure a second current in a second signal path of the radio frequency signal generator; and
    a current imbalance correction circuit configured to adjust a current level in at least one of the first signal path and the second signal path of the radio frequency signal generator to correct for an imbalance between the measured first current and the measured second current.

2. The device of claim 1, further comprising control circuitry which is configured to determine a difference between the measured first current and the measured second current, generate a control signal based on the determined difference between the measured first current and the measured second current, and output the control signal to the current imbalance correction circuit;
    wherein in response to the control signal, the current imbalance correction circuit is configured to inject a current into at least one of the first signal path and the second signal path of the radio frequency signal generator to compensate for the determined difference between the measured first current and the measured second current.

3. The device of claim 1, wherein the first current and the second current comprise one of: an in-phase baseband current and a quadrature-phase baseband current, a pair of complementary in-phase baseband currents, and a pair of complementary quadrature-phase baseband currents.

4. The device of claim 1, wherein the current measurement circuit comprises:
    a current mode digital-to-analog converter circuit which is configured to generate a reference current; and
    a current comparator circuit which is configured to receive one of the first current and the second current as an input current to be measured, compare the reference current with the input current, and generate a compare output signal;
    wherein the current mode digital-to-analog converter circuit is configured to one of increase and decrease the reference current until the current comparator circuit generates a compare output signal which indicates that a magnitude of the reference current is substantially equal to a magnitude of the input current.

5. The device of claim 1, wherein the current measurement circuit comprises:
    a current mode digital-to-analog converter circuit which is configured to generate a reference current; and a current comparator circuit which comprises a current mirror circuit that is configured to receive one of the first current and the second current as an input current to be measured and generate a mirrored version of the input current;

wherein the current comparator circuit is configured to compare the reference current with the mirrored version of the input current, and generate a compare output signal;

wherein the current mode digital-to-analog converter circuit is configured to one of increase and decrease the reference current until the current comparator circuit generates a compare output signal which indicates that a magnitude of the reference current is substantially equal to a magnitude of the mirrored version of the input current.

6. The device of claim 5, wherein the current comparator circuit comprises:

a first transistor comprising a drain terminal coupled to an input node of the current comparator circuit, a source terminal coupled to a power supply node, and a gate terminal coupled to a first node;

a first switch coupled between the input node and the first node;

a second switch coupled between the first node and the power supply node;

a second transistor comprising a gate terminal coupled to the first node, a source terminal coupled to the power supply node, and a drain terminal coupled to a second node; and a voltage comparator comprising a first input terminal coupled to a threshold voltage node, and a second input terminal coupled to the second node;

wherein an output of the current mode digital-to-analog converter circuit is coupled to the second node;

wherein during the calibration process, the first switch is activated to configure the first transistor as a diode-connected transistor by coupling the gate terminal and the drain terminal of the first transistor, and the second switch is deactivated, to enable the input current to flow into the current measurement circuit.

7. The device of claim 6, wherein:

the current comparator circuit further comprises a low-pass filter circuit which is configured to enable the current comparator circuit to measure a direct current (DC) offset component of an alternating current (AC) input current; and the low-pass filter circuit is one of (i) coupled between the first node and the gate terminal of the second transistor, and (ii) coupled to the second input terminal of the voltage comparator.

8. A system, comprising:

a radio frequency signal generator which is configured to convert a baseband signal to a radio frequency signal, the radio frequency signal generator comprising a first signal path to process a first signal component of the baseband signal, and a second signal path to process a second signal component of the baseband signal; and a calibration system which is configured to perform a calibration process to calibrate the radio frequency signal generator, wherein the calibration system comprises:

a current measurement circuit which is configured, during the calibration process, to measure a first current in the first signal path of the radio frequency signal generator, and to measure a second current in the second signal path of the radio frequency signal generator; and a current imbalance correction circuit configured to adjust a current level in at least one of the first signal path and the second signal path of the radio frequency signal generator to correct for an imbalance between the measured first current and the measured second current.

9. The system of claim 8, wherein the calibration system further comprises control circuitry which is configured to determine a difference between the measured first current and the measured second current, generate a control signal based on the determined difference between the measured first current and the measured second current, and output the control signal to the current imbalance correction circuit;

wherein in response to the control signal, the current imbalance correction circuit is configured to inject a current into at least one of the first signal path and the second signal path of the radio frequency signal generator to compensate for the determined difference between the measured first current and the measured second current.

10. The system of claim 8, wherein the current imbalance correction circuit comprises:

a first current mode digital-to-analog converter circuit configured to output a first current in the first signal path; and a second current mode digital-to-analog converter circuit configured to output a second current in the second signal path.

11. The system of claim 8, wherein:

the baseband signal is a quadrature baseband signal comprising an in-phase signal component and a quadrature-phase signal component;

the first signal path is configured to process the in-phase signal component; and the second signal path is configured to process the quadrature-phase signal component.

12. The system of claim 8, wherein:

the radio frequency signal generator comprises a plurality of current mode stages comprising a baseband input stage, a mixer stage coupled to output nodes of the baseband input stage, and an attenuation stage coupled to output nodes of the mixer stage;

the current measurement circuit is coupled to the output nodes of the mixer stage; and during the calibration process, the baseband input stage is configured to output static baseband currents in the first signal path and the second signal path, and the attenuation stage is turned off to allow the first current and the second current to flow from at least one output node of the mixer stage to an input of the current measurement circuit.

13. The system of claim 12, wherein:

the baseband input stage is configured to comprise a variable gain which can be adjusted to a target gain setting over a range of gain settings; and the current measurement circuit comprises a current measurement range that is scalable to match full-scale current levels of the first current and the second current, which are a function of the target gain setting.

14. The system of claim 12, wherein during the calibration process, the mixer stage is configured by applying static voltages to local oscillator inputs of the mixer stage to selectively activate one transistor in the mixer stage at a given time to output one of the first current and the second current on the at least one output node of the mixer stage at the given time.

15. The system of claim 12, wherein during the calibration process, the mixer stage is configured by applying a switching local oscillator signal to at least one local oscillator input of the mixer stage to selectively activate one transistor in the mixer stage at a given time, and applying static voltages to other local oscillator inputs at the given time to selectively deactivate other transistors in the mixer stage, to output one of the first current and the second current on the at least one output node of the mixer stage at the given time.

16. The system of claim 8, wherein the current measurement circuit comprises:
 a current mode digital-to-analog converter circuit which is configured to generate a reference current; and
 a current comparator circuit which is configured to receive one of the first current and the second current as an input current to be measured, compare the reference current with the input current, and generate a compare output signal;
 wherein the current mode digital-to-analog converter circuit is configured to one of increase and decrease the reference current until the current comparator circuit generates a compare output signal which indicates that a magnitude of the reference current is substantially equal to a magnitude of the input current.

17. The system of claim 8, wherein the current measurement circuit comprises:
 a current mode digital-to-analog converter circuit which is configured to generate a reference current; and
 a current comparator circuit which comprises a current mirror circuit that is configured to receive one of the first current and the second current as an input current to be measured and generate a mirrored version of the input current;
 wherein the current comparator circuit is configured to compare the reference current with the mirrored version of the input current, and generate a compare output signal;
 wherein the current mode digital-to-analog converter circuit is configured to one of increase and decrease the reference current until the current comparator circuit generates a compare output signal which indicates that a magnitude of the reference current is substantially equal to a magnitude of the mirrored version of the input current.

18. A system, comprising:
 a quantum processor comprising at least one superconducting quantum bit;
 an arbitrary waveform generator system comprising at least one arbitrary waveform generator channel configured to convert a baseband signal to a radio frequency control pulse which controls the at least one superconducting quantum bit, the at least one arbitrary waveform generator channel comprising a first signal path to process a first signal component of the baseband signal, and a second signal path to process a second signal component of the baseband signal; and
 a calibration system which is configured to perform a calibration process to calibrate the at least one arbitrary waveform generator channel, wherein the calibration system comprises:
  a current measurement circuit which is configured, during the calibration process, to measure a first current in the first signal path of the at least one arbitrary waveform generator channel, and to measure a second current in the second signal path of the at least one arbitrary waveform generator channel; and
  a current imbalance correction circuit configured to adjust a current level in at least one of the first signal path and the second signal path of the at least one arbitrary waveform generator channel to correct for an imbalance between the measured first current and the measured second current.

19. The system of claim 18, wherein the calibration system further comprises control circuitry which is configured to determine a difference between the measured first current and the measured second current, generate a control signal based on the determined difference between the measured first current and the measured second current, and output the control signal to the current imbalance correction circuit;
 wherein in response to the control signal, the current imbalance correction circuit is configured to inject a current into at least one of the first signal path and the second signal path of the at least one arbitrary waveform generator channel to compensate for the determined difference between the measured first current and the measured second current.

20. The system of claim 18, wherein the current measurement circuit comprises:
 a current mode digital-to-analog converter circuit which is configured to generate a reference current; and
 a current comparator circuit which is configured to receive one of the first current and the second current as an input current to be measured, compare the reference current with the input current, and generate a compare output signal;
 wherein the current mode digital-to-analog converter circuit is configured to one of increase and decrease the reference current until the current comparator circuit generates a compare output signal which indicates that a magnitude of the reference current is substantially equal to a magnitude of the input current.

21. The system of claim 18, wherein:
 the at least one arbitrary waveform generator channel comprises a plurality of current mode stages comprising a baseband input stage, a mixer stage coupled to output nodes of the baseband input stage, and an attenuation stage coupled to output nodes of the mixer stage;
 the current measurement circuit is coupled to the output nodes of the mixer stage; and
 during the calibration process, the baseband input stage is configured to output static baseband currents in the first signal path and the second signal path, and the attenuation stage is turned off to allow the first current and the second current to flow from at least one output node of the mixer stage to an input of the current measurement circuit.

22. A computer program product for performing a calibration process to calibrate a radio frequency signal generator, the computer program product comprising:
 one or more computer readable storage media, and program instructions collectively stored on the one or more computer readable storage media, the program instructions comprising:
 program instructions to configure a current measurement circuit, during the calibration process, to measure a first current in a first signal path of the radio frequency signal generator, and to measure a second current in a second signal path of the radio frequency signal generator; and program instructions to configure a current imbalance correction circuit to adjust a current level in at least one of the first signal path and the second signal path of the radio frequency signal generator to correct for an imbalance between the measured first current and the measured second current.

23. The computer program product of claim 22, further comprising program instructions to determine a difference between the measured first current and the measured second current, and generate a control signal based on the determined difference between the measured first current and the measured second current, and output the control signal to the current imbalance correction circuit;

wherein in response to the control signal, the current imbalance correction circuit is configured to inject a current into at least one of the first signal path and the second signal path of the radio frequency signal generator to compensate for the determined difference between the measured first current and the measured second current.

24. A method, comprising:

measuring a first current in a first signal path of a radio frequency signal generator;

measuring a second current in a second signal path of the radio frequency signal generator; and adjusting a current level in at least one of the first signal path and the second signal path of the radio frequency signal generator to correct for an imbalance between the measured first current and the measured second current.

25. The method of claim 24, comprising:

determining a difference between the measured first current and the measured second current; and generating a control signal based on the determined difference between the measured first current and the measured second current;

wherein adjusting the current level in at least one of the first signal path and the second signal path of the radio frequency signal generator is performed in response to the control signal to compensate for the determined difference between the measured first current and the measured second current.

* * * * *